(12) United States Patent
Yim et al.

(10) Patent No.: US 12,507,394 B2
(45) Date of Patent: Dec. 23, 2025

(54) SEMICONDUCTOR DEVICES

(71) Applicant: Samsung Electronics Co., Ltd., Suwon-si (KR)

(72) Inventors: Soobin Yim, Hwaseong-si (KR); Insu Kim, Hwaseong-si (KR); Seohyun Maeng, Hwaseong-si (KR); Kijong Park, Yongin-si (KR); Imsoo Park, Seongnam-si (KR); Kiseok Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 412 days.

(21) Appl. No.: 18/094,789

(22) Filed: Jan. 9, 2023

(65) Prior Publication Data
US 2023/0301063 A1 Sep. 21, 2023

(30) Foreign Application Priority Data
Mar. 17, 2022 (KR) .................. 10-2022-0033237

(51) Int. Cl.
*H10B 12/00* (2023.01)
(52) U.S. Cl.
CPC ............. *H10B 12/30* (2023.02); *H10B 12/05* (2023.02)
(58) Field of Classification Search
None
See application file for complete search history.

(56) References Cited

U.S. PATENT DOCUMENTS

| 10,607,995 | B2 | 3/2020 | Roberts et al. |
| 10,804,273 | B2 | 10/2020 | Ramaswamy |

(Continued)

FOREIGN PATENT DOCUMENTS

| KR | 10-2020-0061871 A | 6/2020 |
| KR | 1020210007739 A | 1/2021 |

(Continued)

OTHER PUBLICATIONS

Office Action dated Jan. 16, 2024 from the Taiwan Intellectual Property Office for the corresponding Taiwanese Patent Application No. 112103771.

*Primary Examiner* — Nilufa Rahim
(74) *Attorney, Agent, or Firm* — Muir Patent Law, PLLC

(57) ABSTRACT

A semiconductor device may include first pillar insulation patterns on a substrate, second pillar insulation patterns on the substrate, silicon patterns stacked on the substrate to be spaced apart from each other in a vertical direction, a word line on each of upper and lower surfaces of each silicon pattern, a bit line contacting a first sidewall of at least a first silicon pattern of the silicon patterns, and a capacitor contacting a second sidewall of the first silicon pattern. Each of the first pillar insulation patterns may extend in the vertical direction from an upper surface of the substrate. The first pillar insulation patterns may be spaced apart from each other in a first direction, and may be aligned in a line. Each of the second pillar insulation patterns may extend in the vertical direction. The second pillar insulation patterns may be spaced apart from each other in the first direction, and may be aligned in a line. The second pillar insulation patterns and the first pillar insulation patterns may overlap with each other in a second direction perpendicular to the first direction. Each of the silicon patterns may extend in the second direction and be positioned between two first pillar insulation patterns and between two second pillar insulation patterns, and each of the silicon patterns may include two sidewalls opposite each other in the first direction and having a straight line shape. Each word line may extend in the first direction to cross the silicon patterns. Each word line may contact a sidewall of at least one insulation pattern of the first pillar insulation patterns and/or at least one insulation pattern of the second pillar insulation patterns.

(Continued)

The bit line may extend in the vertical direction. The capacitor may be disposed in a horizontal direction to have a dielectric layer horizontally between a lower electrode and an upper electrode.

19 Claims, 35 Drawing Sheets

(56) References Cited

U.S. PATENT DOCUMENTS

| | | |
|---|---|---|
| 2020/0083225 A1 | 3/2020 | Ma et al. |
| 2020/0212041 A1 | 7/2020 | Machkaoutsan et al. |
| 2020/0279601 A1 | 9/2020 | Kim et al. |
| 2021/0012828 A1 | 1/2021 | Kim et al. |
| 2021/0057416 A1 | 2/2021 | Kim et al. |
| 2021/0104527 A1 | 4/2021 | Son |
| 2021/0242210 A1 | 8/2021 | Lee |
| 2021/0257366 A1 | 8/2021 | Lee |
| 2022/0005809 A1 | 1/2022 | Kim et al. |
| 2022/0122976 A1* | 4/2022 | Kim .................. H10B 12/482 |
| 2022/0208734 A1 | 6/2022 | Keeth |
| 2022/0208766 A1* | 6/2022 | Kim .................. H10B 12/488 |

FOREIGN PATENT DOCUMENTS

| | | |
|---|---|---|
| KR | 1020210042225 A | 4/2021 |
| KR | 10-2021-0077098 A | 6/2021 |
| KR | 1020210096698 A | 8/2021 |
| KR | 1020210098198 A | 8/2021 |
| KR | 1020210105594 A | 8/2021 |
| TW | 202018915 A | 5/2020 |

* cited by examiner (V-V')

(V-V')

(V-V')

(V-V')

SEMICONDUCTOR DEVICES

CROSS-REFERENCE TO RELATED APPLICATION

This application claims priority under 35 USC § 119 to Korean Patent Application No. 10-2022-0033237, filed on Mar. 17, 2022, in the Korean Intellectual Property Office (KIPO), the contents of which are incorporated by reference herein in their entirety.

BACKGROUND

1. Field

Embodiments relate to a semiconductor device. More particularly, embodiments relate to a three-dimensional semiconductor memory device.

2. Description of the Related Art

As an integration degree of semiconductor memory devices increases, three-dimensional semiconductor memory devices in which memory cells are stacked in a vertical direction have been developed.

SUMMARY

Example embodiments provide a semiconductor device having a high integration degree.

According to example embodiments, a semiconductor device may include first pillar insulation patterns on a substrate, second pillar insulation patterns on the substrate, silicon patterns stacked on the substrate to be spaced apart from each other in a vertical direction, a word line on each of upper and lower surfaces of each silicon pattern, a bit line contacting a first sidewall of at least a first silicon pattern of the silicon patterns, and a capacitor contacting a second sidewall of the first silicon pattern. Each of the first pillar insulation patterns may extend in the vertical direction from an upper surface of the substrate. The first pillar insulation patterns may be spaced apart from each other in a first direction, and may be aligned in a line. Each of the second pillar insulation patterns may extend in the vertical direction. The second pillar insulation patterns may be spaced apart from each other in the first direction, and may be aligned in a line. The second pillar insulation patterns and the first pillar insulation patterns may overlap with each other in a second direction perpendicular to the first direction. Each of the silicon patterns may extend in the second direction and be positioned between two first pillar insulation patterns and between two second pillar insulation patterns, and each of the silicon patterns may include two sidewalls opposite each other in the first direction and having a straight line shape. Each word line may extend in the first direction to cross the silicon patterns. Each word line may contact a sidewall of at least one insulation pattern of the first pillar insulation patterns and/or at least one insulation pattern of the second pillar insulation patterns. The bit line may extend in the vertical direction. The capacitor may be disposed in a horizontal direction to have a dielectric layer horizontally between a lower electrode and an upper electrode.

According to example embodiments, a semiconductor device may include a multi-stacked structure in which memory cell layers and insulation layer patterns are alternately stacked on a substrate, first pillar insulation patterns passing through the multi-stacked structure in a vertical direction, and second pillar insulation patterns passing through the multi-stacked structure in the vertical direction. The first pillar insulation patterns may be spaced apart from each other in a first direction, and may be aligned in a line. The second pillar insulation patterns may be spaced apart from each other in the first direction, and may be aligned in a line. Each second pillar insulation pattern and a respective first pillar insulation pattern may overlap each other in a second direction perpendicular to the first direction. Each of the memory cell layers may include a silicon pattern and a word line. The silicon pattern may be between the first and second pillar insulation patterns, and may extend in the second direction. The silicon pattern may extend in the second direction between a set of first pillar insulation patterns and a set of second pillar insulation patterns, and may be spaced apart from the set of first pillar insulation patterns and the set of second pillar insulation patterns. Sidewalls of the silicon pattern opposite each other in the first direction may have a straight line shape. The word line may be on each of upper and lower surfaces of the silicon pattern. The word line may extend in the first direction to cross the silicon pattern. At least one sidewall extending along the first direction of each word line may include a concave portion.

According to example embodiments, a semiconductor device may include a silicon pattern spaced apart from a surface of a substrate, a word line on each of an upper surface and a lower surface of the silicon pattern, a first impurity region in the silicon pattern adjacent to a first sidewall of the silicon pattern, a second impurity region in the silicon pattern adjacent to a second sidewall of the word line opposite the first sidewall, a bit line on the first sidewall of the silicon pattern, and a capacitor on the second sidewall of the silicon pattern. The silicon pattern has two sidewalls opposite each other in a first direction. The sidewalls may have a straight line shape, and the silicon pattern may extend in a second direction perpendicular to the first direction. The word lines may extend in the first direction to cross the silicon pattern. The bit line may extend in a vertical direction, and the bit line may contact the first impurity region. The capacitor may be disposed in a horizontal direction to have a dielectric layer horizontally between a lower electrode and an upper electrode, and the capacitor may contact the second impurity region. Sidewalls of the word line opposite to each other in the second direction and overlapping the silicon pattern may have a straight line shape extending in the first direction. Portions of the sidewalls of the word line opposite to each other in the second direction and not overlapping the silicon pattern may have a concave shape such that a width is decreased.

In the semiconductor device in accordance with example embodiments, both sides in the first direction of an upper surface of the silicon pattern for forming the memory cell may have a straight line shape, and the silicon pattern may extend in the second direction. As a width of the silicon pattern is uniform, characteristics of unit devices (e.g., transistors) formed on the silicon pattern may be uniform. In addition, the word line may be formed on each of the upper and lower surfaces of the silicon pattern, and the word line may extend in the first direction to cross the silicon patterns. Both sidewalls in the second direction of the upper surface of the word line overlapping the silicon pattern may have a straight line shape extending in the first direction. A portion of both sidewalls in the second direction of the upper surface of the word line not overlapping the silicon pattern may have a concave shape such that a width is decreased. The word line may extend in the first direction without being cut at a cross point of the silicon pattern and the word line.

BRIEF DESCRIPTION OF THE DRAWINGS

Example embodiments will be more clearly understood from the following detailed description taken in conjunction with the accompanying drawings.

FIGS. 1 to 3 are a perspective view, plan view, and cross-sectional view illustrating three-dimensional semiconductor memory devices in accordance with example embodiments;

FIG. 4 is a perspective view illustrating a silicon pattern of the 3D semiconductor memory device shown in FIG. 1;

FIG. 5 is a perspective view illustrating a silicon pattern and word lines of the 3D semiconductor memory device shown in FIG. 1;

FIG. 6 is a plan view illustrating a three-dimensional semiconductor memory device according to embodiments of the present invention;

FIG. 7 is a perspective view illustrating a silicon pattern and a word line of the 3D semiconductor memory device shown in FIG. 6;

FIG. 8 is a plan view illustrating a three-dimensional semiconductor memory device in accordance with example embodiments;

FIG. 9 is a perspective view illustrating a silicon pattern and a word line of the 3D semiconductor memory device shown in FIG. 8;

FIG. 10 is a plan view illustrating a three-dimensional semiconductor memory device in accordance with example embodiments;

FIGS. 11 to 40 are cross-sectional views, plan views, and perspective views for explaining a method of manufacturing a 3D semiconductor memory device in accordance with example embodiments.

DESCRIPTION OF EMBODIMENTS

Figure 1:
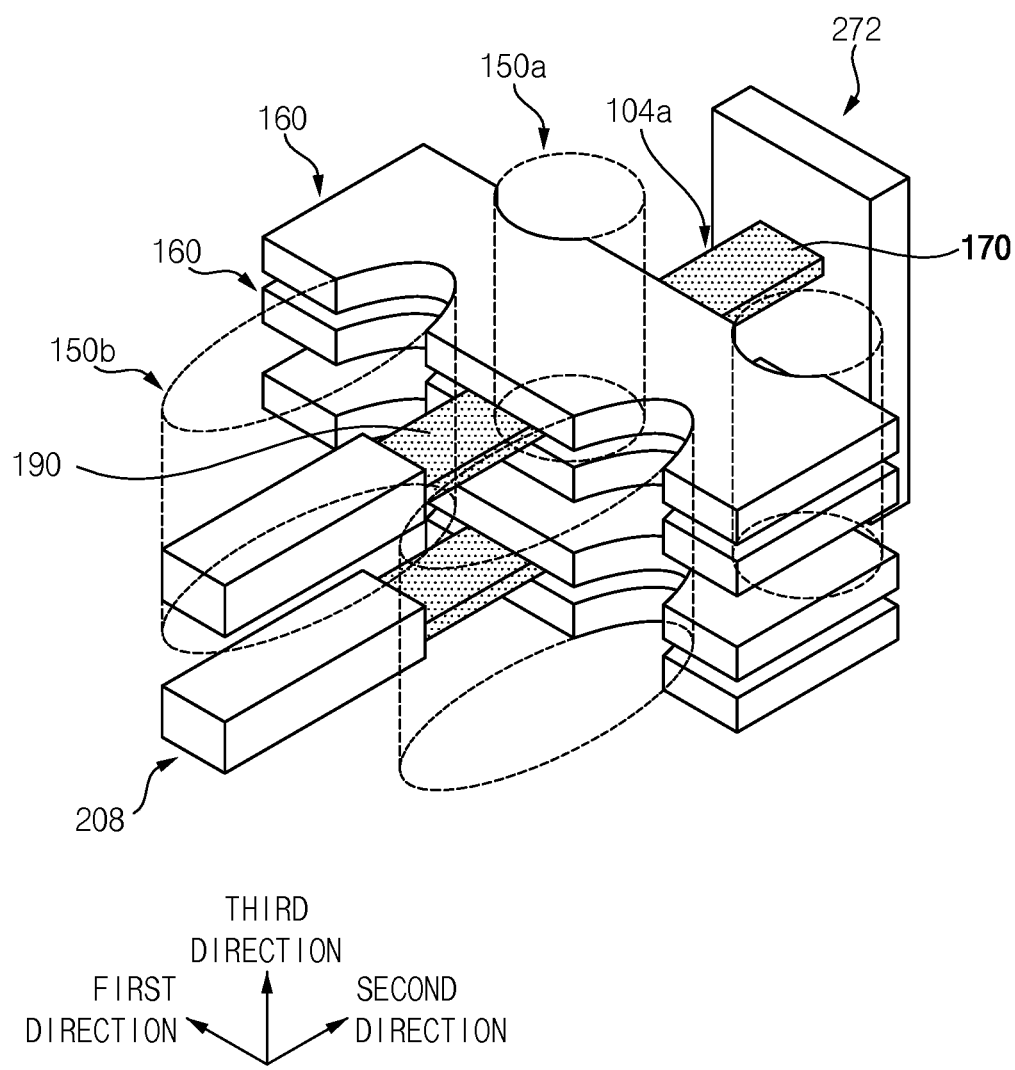
FIGS. 1 to 40 represent non-limiting, example embodiments as described herein.
Figure 2:
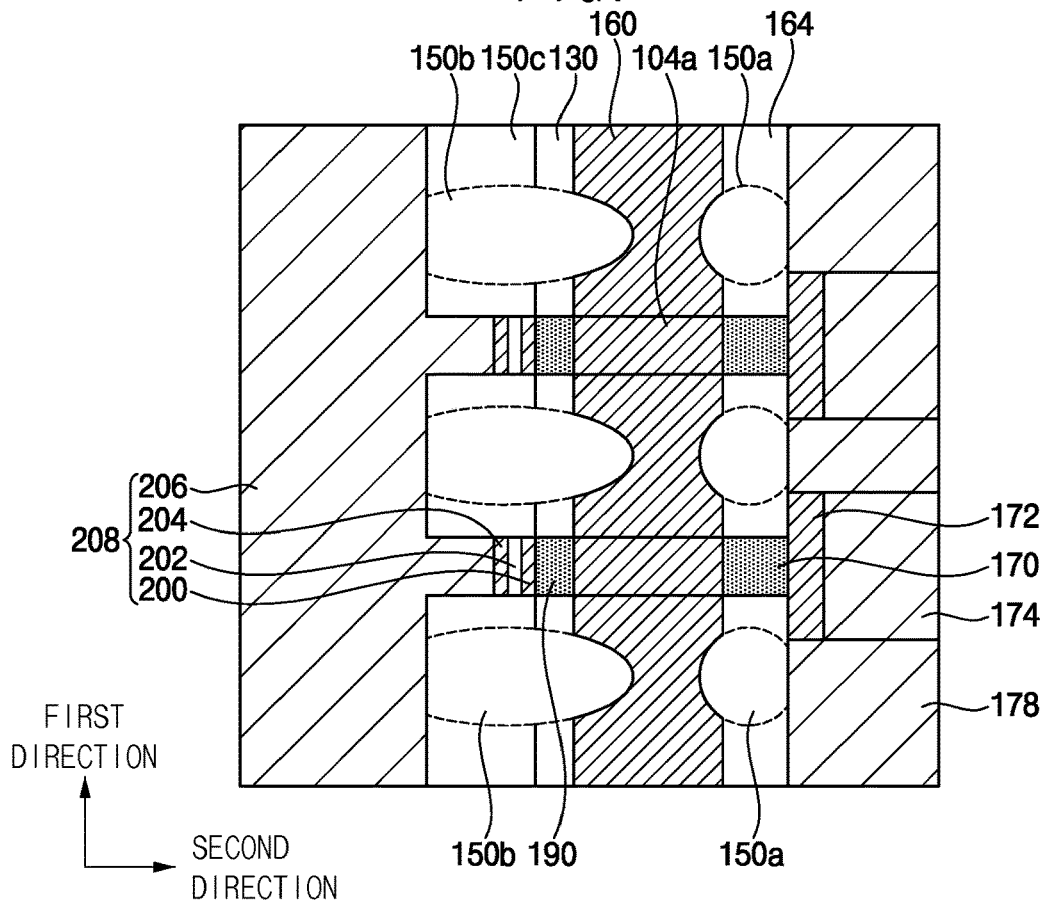
Figure 3:
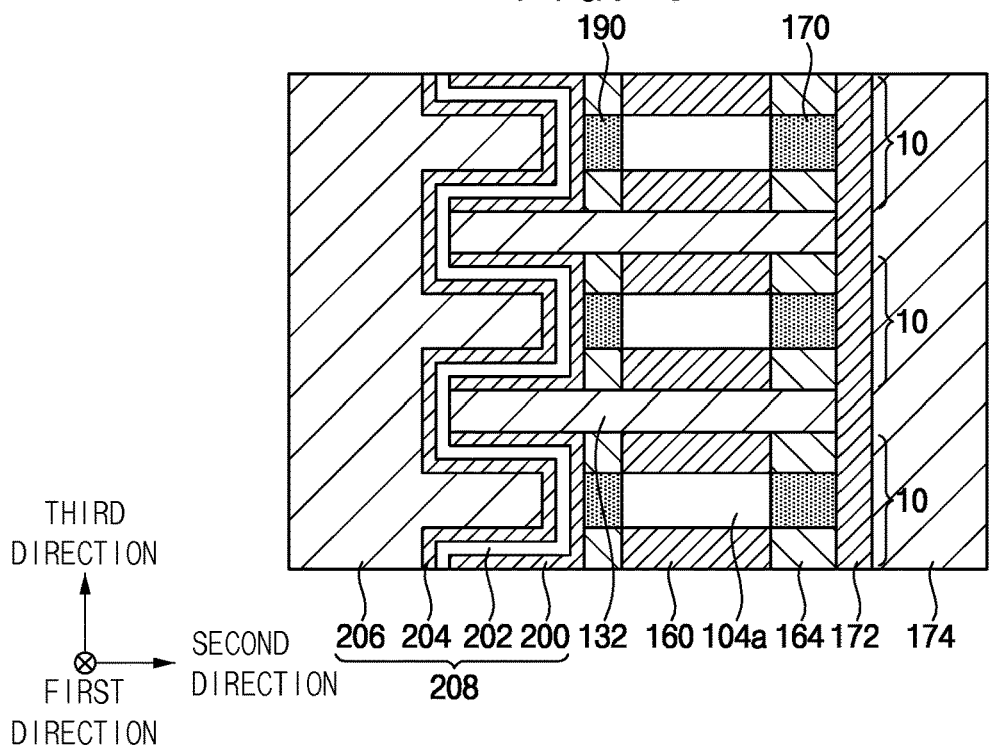
Figure 4:
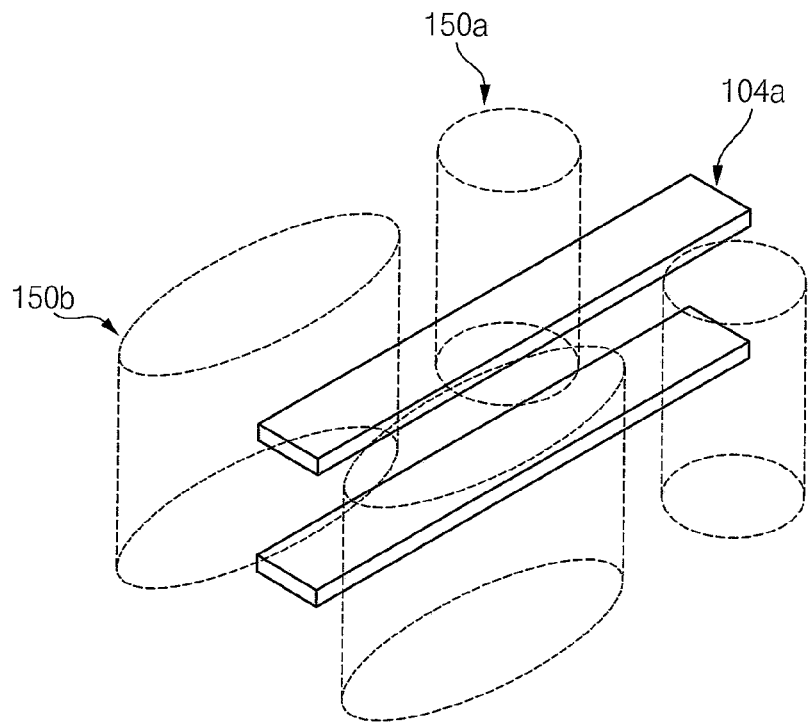
Figure 5:
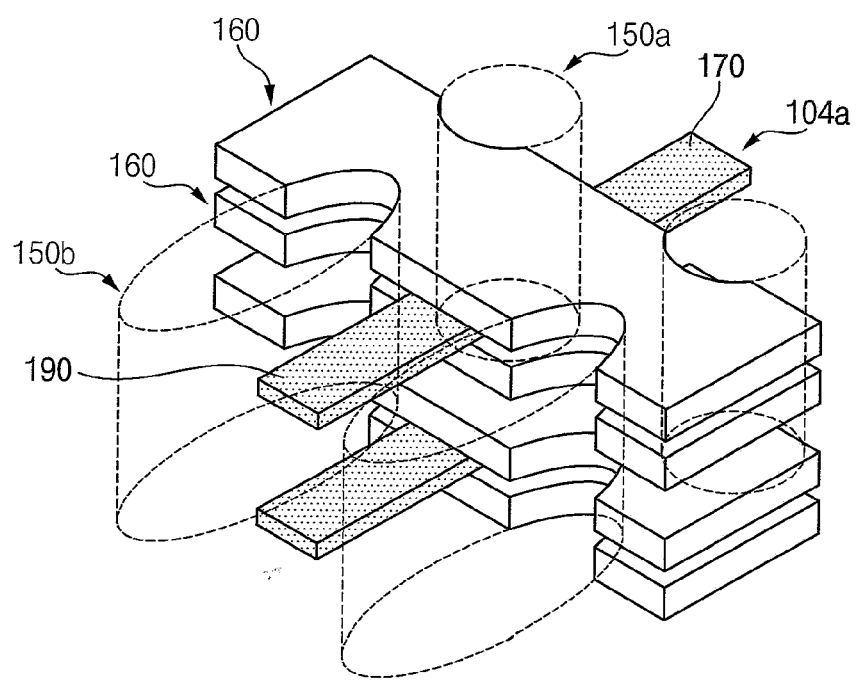

FIGS. 1, 2, and 3 are a perspective view, a plan view and a cross-sectional view illustrating a three-dimensional semiconductor memory device in accordance with example embodiments, respectively. FIG. 4 is a perspective view illustrating a silicon pattern of the three-dimensional semiconductor memory device shown in FIG. 1. FIG. 5 is a perspective view illustrating a silicon pattern and word lines of the three-dimensional semiconductor memory device shown in FIG. 1.

The following three-dimensional semiconductor memory device may be a DRAM device, for example. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips. The various figures show portions of a semiconductor device.

Referring to FIGS. 1 to 5, memory cell layers 10 may be stacked on a silicon substrate (not shown). The memory cell layers 10 may be spaced apart from each other in a vertical direction perpendicular to a surface of the silicon substrate. Each of the memory cell layers 10 may include a transistor and a capacitor 208. A bit line 172 may be formed to be electrically connected to a portion of the transistor of each of the memory cell layers 10.

The silicon substrate may include a single crystal silicon substrate, for example. The silicon substrate may have a (100) crystal orientation.

The transistor may include a silicon pattern 104a, a word line 160 (or pair of word lines 160) and first and second impurity regions 170 and 190. The transistor may be vertically stacked on the silicon substrate. The bit line 172 may extend in the vertical direction (e.g., a third direction), and may contact the first impurity regions 170 formed in each layer. The bit line 172 may have a pillar shape, e.g., extending vertically. The capacitor 208 may contact the second impurity region 190 formed in each layer, and may be formed on a sidewall of the second impurity region 190 in a lateral direction.

Particularly, a multi-stacked structure in which the memory cell layer 10 and a third filling insulation pattern 132 are alternately stacked in the vertical direction may be formed on the silicon substrate. The multi-stacked structure may extend in a first direction. The first direction may be a direction horizontal to the surface of the silicon substrate, and may be an extending direction of a word line. Throughout this specification, when a component is described as having an "extending direction" or is described as "extending lengthwise," the component extends further in the noted direction than in other directions.

In the multi-stacked structure, each of memory cell layers 10 may be described. The memory cell layer 10 may include the silicon pattern 104a. The silicon pattern 104a may include or be formed of single crystal silicon. The silicon pattern 104a may be formed, for example, by an epitaxial growth process.

The silicon pattern 104a may extend in a second direction perpendicular to the first direction and horizontal to the surface of the silicon substrate. A fourth filling insulation pattern 150c may be formed on both sides (e.g., opposite sides) facing in the first direction (herein after, sides in the first direction) of the silicon pattern 104a. The fourth filling insulation pattern 150c may include or may be formed of silicon nitride.

A gate insulation layer (not shown) may be formed on a surface of the silicon pattern 104a. The gate insulation layer may include or may be formed of, e.g., silicon oxide.

A word line 160 may be formed on the gate insulation layer above and below the silicon pattern 104a. Word lines 160 may be formed on the upper and lower surfaces of the silicon pattern 104a, respectively. Each word line 160 may extend in the first direction to cross the silicon pattern 104a. Each word line 160 may extend without being cut at a cross point of the silicon pattern 104a and the word line 160 (e.g., without having a cut-out portion at the intersection of the silicon pattern 104a and the word line 160. The term "contact," as used herein, refers to a direct connection (i.e., touching) unless the context indicates otherwise. A pair of word lines contacting and adjacent to a silicon pattern 104a may be described here simply as a word line, since they may function together as a single word line.

In example embodiments, fifth filling insulation patterns 164 may be formed on a side in the second direction of the word line 160. The fifth insulation patterns 164 may include or may be formed of silicon oxide and/or silicon nitride. It should be noted that ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Impurities may be doped at edges, or ends, of the silicon pattern 104a not vertically overlapping the word line 160 and adjacent to opposite sidewalls of the word line 160, to form a first impurity region 170 and a second impurity region 190, respectively. The first impurity region 170 may be formed in the silicon pattern 104a adjacent to a first side of the word line 160. The second impurity region 190 may be formed in the silicon pattern 104a adjacent to a second side of the word line 160.

A layer structure including the silicon pattern 104a, the first and second impurity regions 170 and 190, the word line 160, and the fifth filling insulation pattern 164 may serve as a transistor of the memory cell.

A plurality of layer structures may be arranged to be stacked and spaced apart from each other in the vertical direction. The third filling insulation pattern 132 may be formed between the layer structures. The third filling insulation pattern 132 may protrude laterally from a sidewall in the second direction of the layer structure. The third filling insulation pattern 132 may include or be formed of silicon oxide.

First openings (referred to FIG. 15, 110) may pass through the multi-stacked structure, and may extend to an upper surface of the silicon substrate. First pillar insulation patterns 150a may fill the first openings 110, respectively. The first pillar insulation patterns 150a may extend in the vertical direction from the upper surface of the silicon substrate.

Second openings (referred to FIG. 15, 112) may pass through the multi-stacked structure, and may extend to the upper surface of the silicon substrate. Second pillar insulation patterns 150b may fill the second openings 112, respectively. The second pillar insulation patterns 150b may extend in the vertical direction from the upper surface of the silicon substrate. Each of the first and second pillar insulation patterns 150a and 150b may include or be formed of silicon oxide.

The first pillar insulation patterns 150a may be adjacent to a first sidewall of the multi-stacked structure in the second direction. The second pillar insulation pattern 150b may be adjacent to a second sidewall opposite to the first sidewall of the multi-stacked structure in the second direction.

The first openings 110 may have a hole shape having a first inner width. In example embodiments, an upper surface of the first pillar insulation pattern 150a may have a circular shape.

The first openings 110 may be spaced apart from each other in the first direction, and may be aligned in a straight line in the first direction. Thus, the first pillar insulation patterns 150a may be spaced apart from each other in the first direction, and may be aligned in the straight line in the first direction.

The second openings 112 may have a hole shape having a second inner width greater than the first inner width. A width in the second direction of the second opening 112 may be greater than a width in the second direction of the first opening 110. A width (lateral height) of a lower electrode in a capacitor may be determined by the width in the second direction of the second opening 112. As the width in the second direction of the second opening 112 increases, the width of the lower electrode in the capacitor may increase. Therefore, each of the second openings 112 may have a shape in which a width in the second direction is longer than a width in the first direction. In example embodiments, an upper surface of the second pillar insulation pattern 150b may have an oval shape, such as an elliptical shape.

The second openings 112 may be spaced apart from each other in the first direction, and may be arranged in parallel in a line. Thus, the second pillar insulation patterns 150b may be spaced apart from each other in the first direction, and may be aligned in a straight line in the first direction.

The shape of the upper surface of the first pillar insulation pattern 150a and the shape of the upper surface of the second pillar insulation pattern 150b may be different from each other. The width in the second direction of the upper surface of the second pillar insulation pattern 150b may be greater than the width in the second direction of the upper surface of the first pillar insulation pattern 150a.

The first and second pillar insulation patterns 150a and 150b may face each other in the second direction, and therefore may overlap in the second direction. For example, they may have outermost portions in the second direction that are aligned with each other in the second direction. In the multi-stacked structure, one first pillar insulation pattern 150a and one second pillar insulation pattern 150b may face each other in the second direction.

The silicon pattern 104a of each layer structure may be disposed between two adjacent first pillar insulation patterns 150a and two adjacent second pillar insulation patterns 150b. The silicon pattern 104a may be spaced apart from sidewalls of the first pillar insulation patterns 150a and sidewalls of the second pillar insulation patterns 150b. In one embodiment, the silicon pattern 104a does not contact the sidewalls of the first pillar insulation patterns 150a or the sidewalls of the second pillar insulation patterns 150b. The silicon pattern 104a may extend in the second direction. The silicon pattern 104a may have a line shape in which the second direction is a longitudinal direction.

In a plan view, each of sidewalls in the first direction of the silicon pattern 104a (e.g., the sidewalls opposite to each other in the first direction) may have a straight line shape, which may extend in the second direction from one end or edge of the silicon pattern 104a to the opposite end or edge of the silicon pattern 104a. Both edges (i.e., contours) in the first direction of the upper surface of the silicon pattern 104a may have a straight line shape. The silicon pattern 104a may serve as an active pattern of the memory cell.

As such, the silicon pattern 104a may not have a sidewall profile the same as or similar to a sidewall profile of each of the first and second pillar insulation patterns 150a and 150b. For example, from a plan view, opposite edges of the upper surface of the silicon pattern 104a may not have a rounded portion or a portion having different line widths, and thus the shape of the silicon pattern 104a from a plan view may be rectangular.

Since both sidewalls in the first direction of the silicon pattern 104a have the straight line shape, the line width of the silicon pattern 104a may be uniform. Therefore, the silicon pattern 104a may not have a portion having locally different size. Accordingly, electrical characteristics of unit devices (e.g., transistors) formed on the silicon pattern 104a may be uniform.

Figure 24:
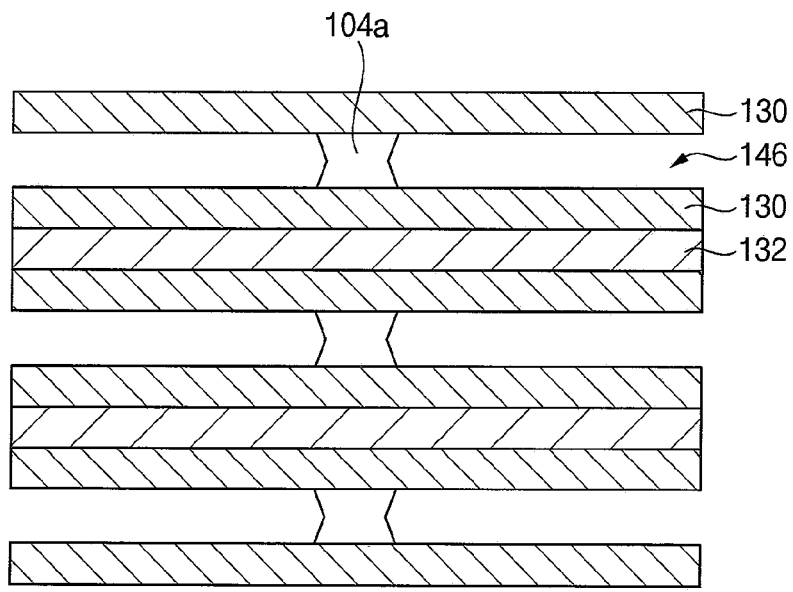

In example embodiments, as illustrated in FIG. 24, in a cross-sectional view, when viewed from the second direction, each of the sidewalls extending in the first direction of the silicon pattern 104a may include a concave portion.

The word line 160 of each layer may extend in the first direction, and may pass one or more regions between a first pillar insulation pattern 150a and an adjacent pillar insulation pattern 150b. The word line 160 may contact the sidewall of at least one of the first pillar insulation patterns 150a and/or at least one of the second pillar insulation patterns 150b. Therefore, at least one sidewall of the word line 160 may be formed along a sidewall profile of one or more first pillar insulation patterns 150a and/or a sidewall profile of one or more second pillar insulation patterns 150b.

In example embodiments, in the plan view, the word line 160 may extend in the first direction to contact the sidewalls of the first and second pillar insulation patterns 150a and 150b. Therefore, the word line 160 may be formed along the sidewall profile of the first pillar insulation patterns 150a and the sidewall profile of the second pillar insulation patterns 150b. In the plan view, the word line 160 includes first portions that do not contact either the first or second pillar insulation patterns 150a and 150b, second portions contacting the first pillar insulation patterns 150a, and third portions contacting the second pillar insulation patterns 150b. The first portions of the word line 160 may have a straight line shape extending in the first direction. Each of the second and third portions of the word line 160 may have a concave shape. Each of the second and third portions of the word line 160 may have a rounded shape.

As such, each of both sidewalls opposite to each other in the second direction (and extending along the first direction) of the upper surface of the word line 160 may include a concave portion in which a width of the word line 160 is decreased. Also, the word line 160 may include relatively narrow portions, e.g., where the edges are concave, and relatively wide portions, e.g., where the edges are parallel and straight.

Since the first pillar insulation patterns 150a are repeatedly disposed to be spaced apart from each other in the first direction, the second portion of the word line 160 may be repeatedly disposed to be spaced apart from each other in the first direction. Since the second pillar insulation patterns 150b are repeatedly disposed to be spaced apart from each other in the first direction, the third portion of the word line 160 may be repeatedly disposed to be spaced apart from each other in the first direction. Also, the second and third portions of the word line 160 may be opposite each other in the second direction.

The first portion of the word line 160 may have a first width. In the word line 160, a region in which the second and third portions are opposite each other in the second direction may have a second width less than the first width. In this case, the second width may gradually decrease, and then gradually increase again, along the first direction.

Both sidewalls in the second direction of the upper surface of the word line 160 overlapping the silicon pattern 104a may have a straight line shape extending in the first direction. Each of both sidewalls in the second direction of the upper surface of the word line 160 not overlapping the silicon pattern 104a may have a concave shape such that the width is decreased. Accordingly, the word line 160 may have the first width at an overlapping portion of the silicon pattern 104a and the word line 160.

A channel of the transistor may be formed at the silicon pattern 104a of the overlapping portion of the silicon pattern 104a and the word line 160. An area of the overlapping portion of the silicon pattern 104a and the word line 160 may be uniform, so that electrical characteristics of the transistors of each layer may be uniform. The overlapping portion of the silicon pattern 104a and the word line 160 may have the first width, so that a channel length of each of the transistors may be secured as the first width.

The word line 160 may include or be formed of a metal material. The word line 160 may include or be formed of, e.g., tungsten.

The bit line 172 may be formed on the first sidewall of the multi-stacked structure. The bit line may extend in the vertical direction to contact the first sidewall of the silicon pattern 104a of each layer structure. The bit line 172 may contact the first impurity region 170 of the silicon pattern 104a of each layer structure. The bit line 172 may be formed on a sidewall of a trench corresponding to the first sidewall of the multi-stacked structure. The bit lines 172 may be spaced apart from each other (e.g., in the first direction) in the trench. The bit lines 172 may include or be formed of a metal or a metal nitride.

A sixth filling insulation pattern 174 and a seventh filling insulation pattern 178 may fill the trench. The sixth and seventh filling insulation patterns 174 and 178 may include or be formed of, e.g., silicon oxide. The sixth filling insulation pattern 174 may be formed on a sidewall of the bit line 172. The sixth and seventh filling insulation patterns 174 and 178 may include the same material, so that the sixth and seventh filling insulation patterns 174 and 178 may be merged into one insulation pattern.

The capacitor 208 may be formed in a gap in the vertical direction between the third filling insulation patterns 132 protruding laterally from one sidewall in the second direction of the layer structure. The capacitor 208 may include the lower electrode 200, a dielectric layer 202, an upper electrode 204 and a plate electrode 206.

In the capacitor 208, the lower electrode 200 may have a cylindrical shape. The lower electrode 200 may be formed in a horizontal direction in each layer. The lower electrode 200 may contact the second sidewall of the silicon pattern 104a (e.g., a sidewall opposite a sidewall that contacts the bit line 172). The lower electrode 200 may contact the second impurity region 190 of the silicon pattern 104a.

The dielectric layer 202 may be conformally formed on the surface of the lower electrode 200. The upper electrode 204 may be conformally formed on the dielectric layer 202. The plate electrode 206 may be formed on the upper electrode 204, and may fill an inner portion of the lower electrode 200 having the cylindrical shape. The plate electrode 206 may have a connected, integrated structure in the vertical direction (e.g., extending continuously vertically past a plurality of silicon patterns 104a).

Each of the lower electrode 200 and the upper electrode 204 may include or may be formed of a metal material such as titanium, tantalum, tungsten, copper, or aluminum, a conductive metal nitride such as titanium nitride or tantalum nitride, or doped semiconductor material such as doped silicon or doped germanium. The dielectric layer 202 may include or be formed of a high-k material. For example, the high-k material may include or may be hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof.

In some example embodiments, in the capacitor, the lower electrode may include a portion that has a pillar shape. The lower electrode may include a portion formed in the horizontal direction in each layer. For each layer structure, the lower electrode may have a cup shape or cylinder shape, having an open end opposite a bottom surface in the second direction.

Figure 6:
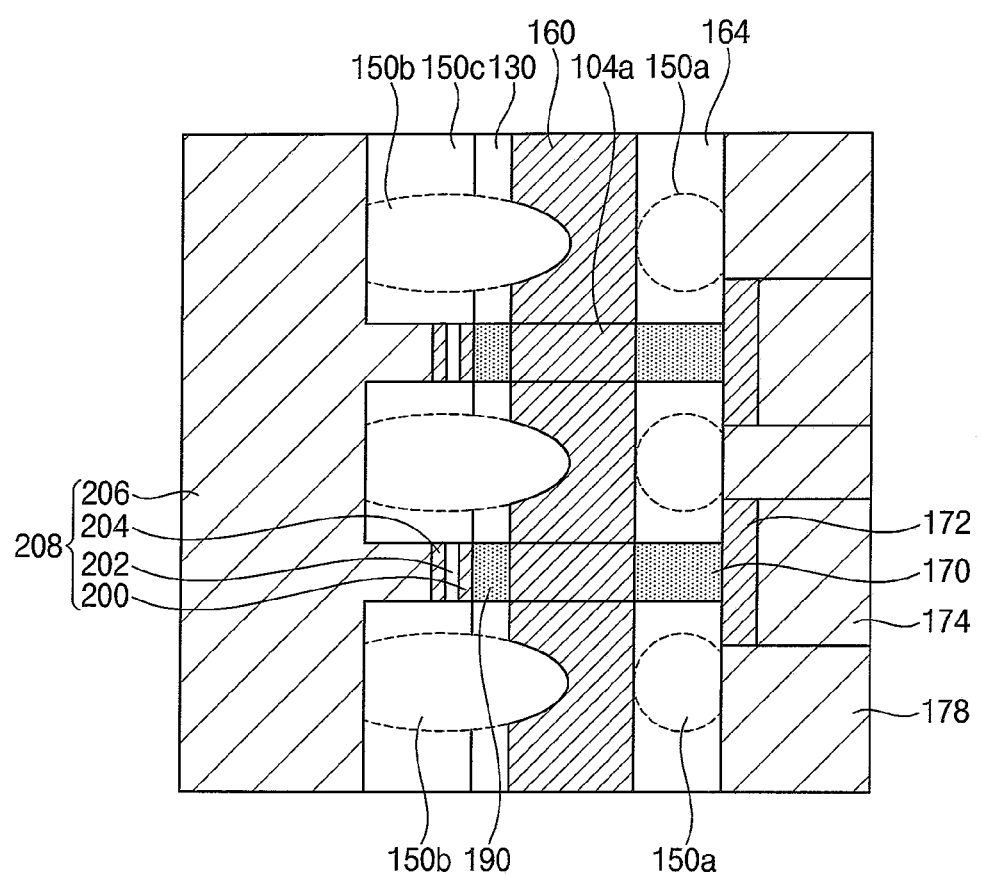
Figure 7:
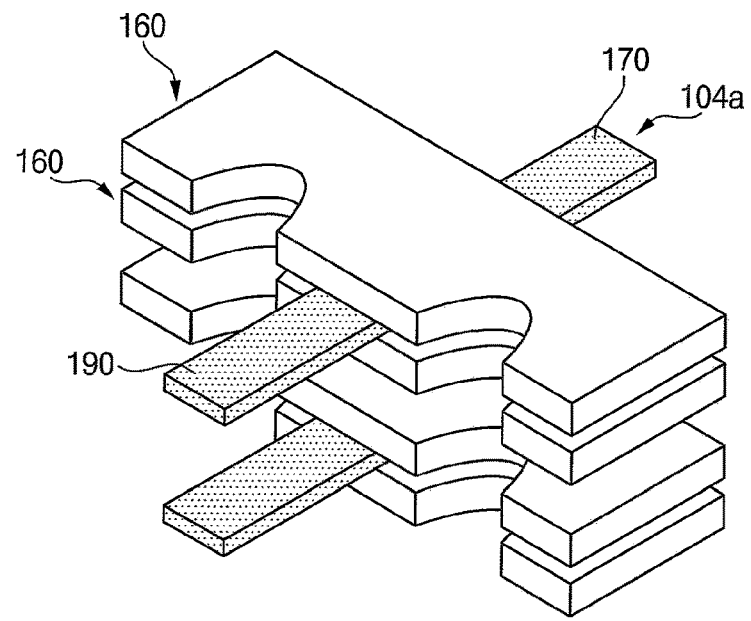

FIG. 6 is a plan view illustrating a three-dimensional semiconductor memory device in accordance with example embodiments. FIG. 7 is a perspective view illustrating a silicon pattern and a word line of the three-dimensional semiconductor memory device shown in FIG. 6.

The three-dimensional semiconductor memory device illustrated in FIGS. 6 and 7 may be the same as the three-dimensional semiconductor memory device described with reference to FIGS. 1 to 5, except for a shape of the word line.

Referring to FIGS. 6 and 7, in a plan view, the word line 160 may include first portions that do not contact the first and second pillar insulation patterns 150a and 150b, and third portions contacting the second pillar insulation patterns 150b. The word line 160 may not contact the first pillar insulation patterns 150a, or may only contact an outermost circumference of a sidewall of the first pillar insulation patterns 150a.

In an upper surface of the word line 160, a sidewall of the word line 160 adjacent to the first pillar insulation pattern 150a may have a straight line shape extending in the first direction. In the upper surface of the word line 160, a sidewall adjacent to the second pillar insulation pattern 150b may alternately have a straight line shape and a rounded shape. For example, the first portion of the word line 160 may have the straight line shape, and the third portion of the word line 160 may have the rounded shape.

As such, at least one of both sidewalls in the second direction of the word line 160 may include the rounded portion.

Figure 8:
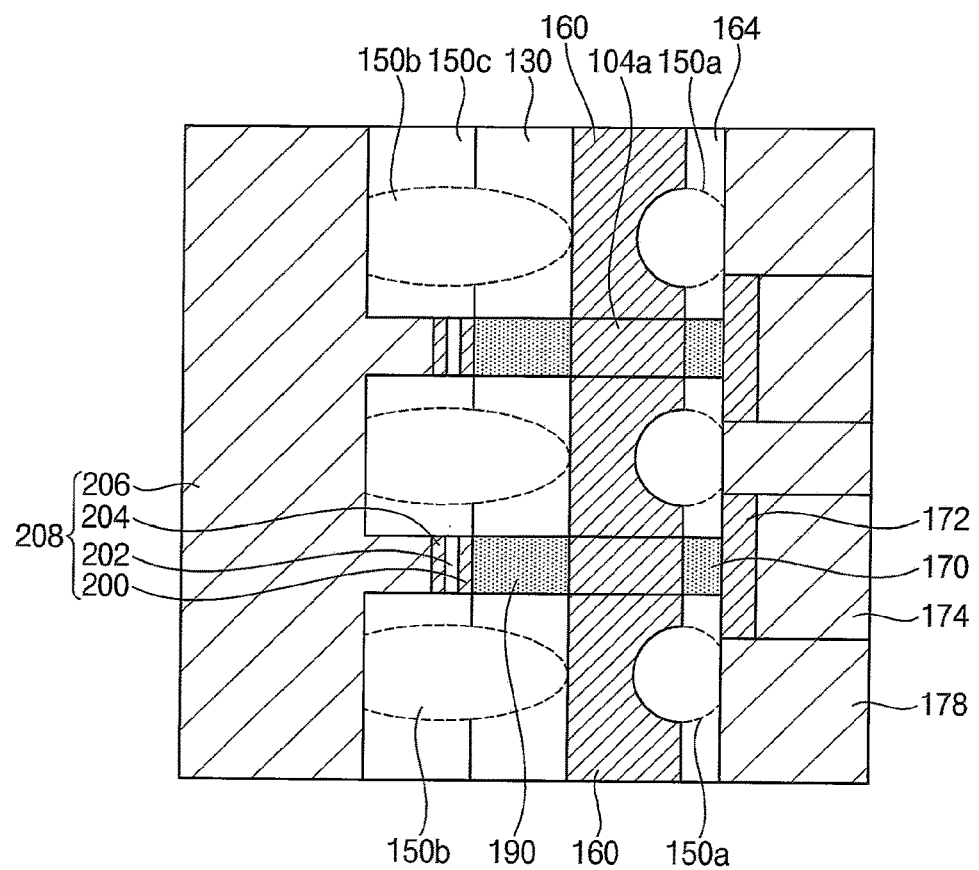
Figure 9:
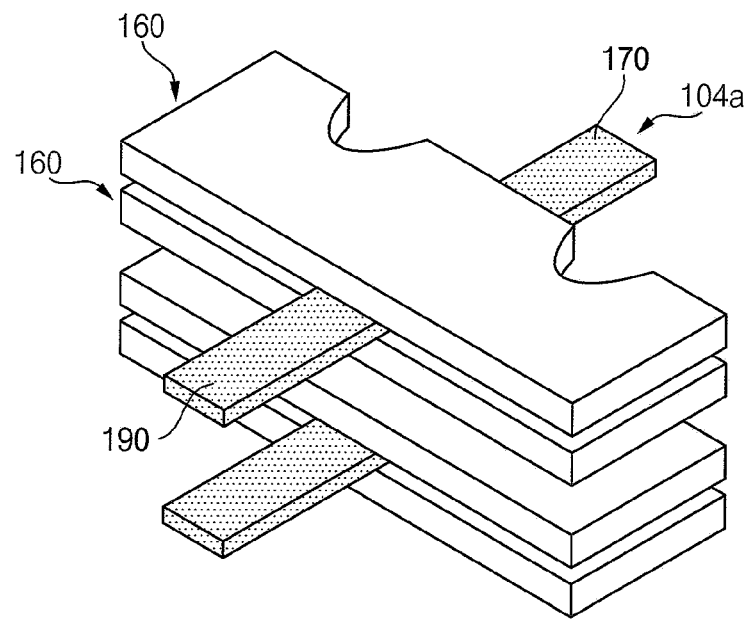

FIG. 8 is a plan view illustrating a three-dimensional semiconductor memory device in accordance with example embodiments. FIG. 9 is a perspective view illustrating a silicon pattern and a word line of the three-dimensional semiconductor memory device shown in FIG. 8.

The three-dimensional semiconductor memory device illustrated in FIGS. 8 and 9 may be the same as the three-dimensional semiconductor memory device described with reference to FIGS. 1 to 5, except for a shape of the word line.

Referring to FIGS. 8 and 9, in a plan view, the word line 160 may include the first portions that do not contact the first and second pillar insulation patterns 150a and 150b, and the second portions contacting the first pillar insulation patterns 150a. The word line 160 may not contact the second pillar insulation pattern 150b, or may only contact an outermost circumference of a sidewall of the second pillar insulation pattern 150b.

In the upper surface of the word line 160, a sidewall adjacent to the second pillar insulation patterns 150b may have a straight line shape extending in the first direction. In the upper surface of the word line 160, a sidewall adjacent to the first pillar insulation patterns 150a may alternately have a straight line shape and a rounded shape. For example, the first portion of the word line 160 may have the straight line shape, and the second portion of the word line 160 may have the rounded shape.

As such, at least one of opposite sidewalls in the second direction of the word line 160 may include the rounded portion.

Figure 10:
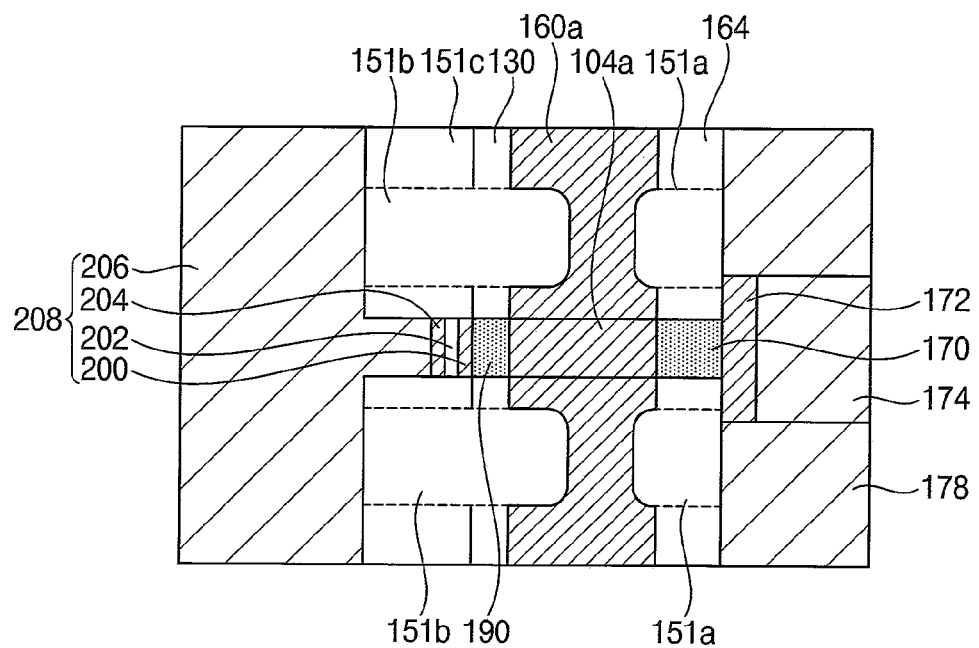

FIG. 10 is a plan view illustrating a three-dimensional semiconductor memory device in accordance with example embodiments.

The three-dimensional semiconductor memory device shown in FIG. 10 may be the same as the three-dimensional semiconductor memory device described with reference to FIGS. 1 to 5, except for a shape of the word line.

Referring to FIG. 10, an upper surface of each of the first and second pillar insulation patterns 151a and 151b may have a rectangular shape.

In example embodiments, the upper surface of each of the first and second pillar insulation patterns 151a and 151b may have a rectangular shape having rounded vertices.

In a plan view, the word line 160a may include the first portions that do not contact the first and second pillar insulation patterns 151a and 151b, the second portions contacting the first pillar insulation patterns 151a, and the third portions contacting the second pillar insulation patterns 151b. The first portions of the word line 160a may have a straight line shape extending in the first direction. The second and third portions of the word line 160a may be formed along sidewalls of the first and second pillar insulation patterns 151a and 151b. For example, each of the second and third portions of the word line 160a may have a concave shape such that the width of the word line 160a is decreased.

However, in some embodiments, similar to FIGS. 6-9, only one of the first pillar insulation patterns 151a or the second pillar insulation patterns 151b may contact the word line 160a. As such, at least one of both sidewalls in the second direction of the word line 160a may include the concave portion.

The first pillar insulation pattern 151a may be repeatedly disposed to be spaced apart in the first direction, so that the second portions of the word line 160a may be repeatedly disposed to be spaced apart from each other in the first direction. The second pillar insulation patterns 151b may be repeatedly disposed to be spaced apart from each other in the first direction, so that the third portions of the word line 160a may be repeatedly disposed to be spaced apart from each other in the first direction. Further, the second and third portions of the word line 160a may be opposite each other in the second direction.

The first portions of the word line 160a may have a first width. In the word line 160a, a region in which the second and third portions are opposite each other in the second direction may have a second width less than the first width.

FIGS. 11 to 40 are cross-sectional views, plan views and perspective views for illustrating a method of manufacturing a three-dimensional semiconductor memory device in accordance with example embodiments.

Figure 11:
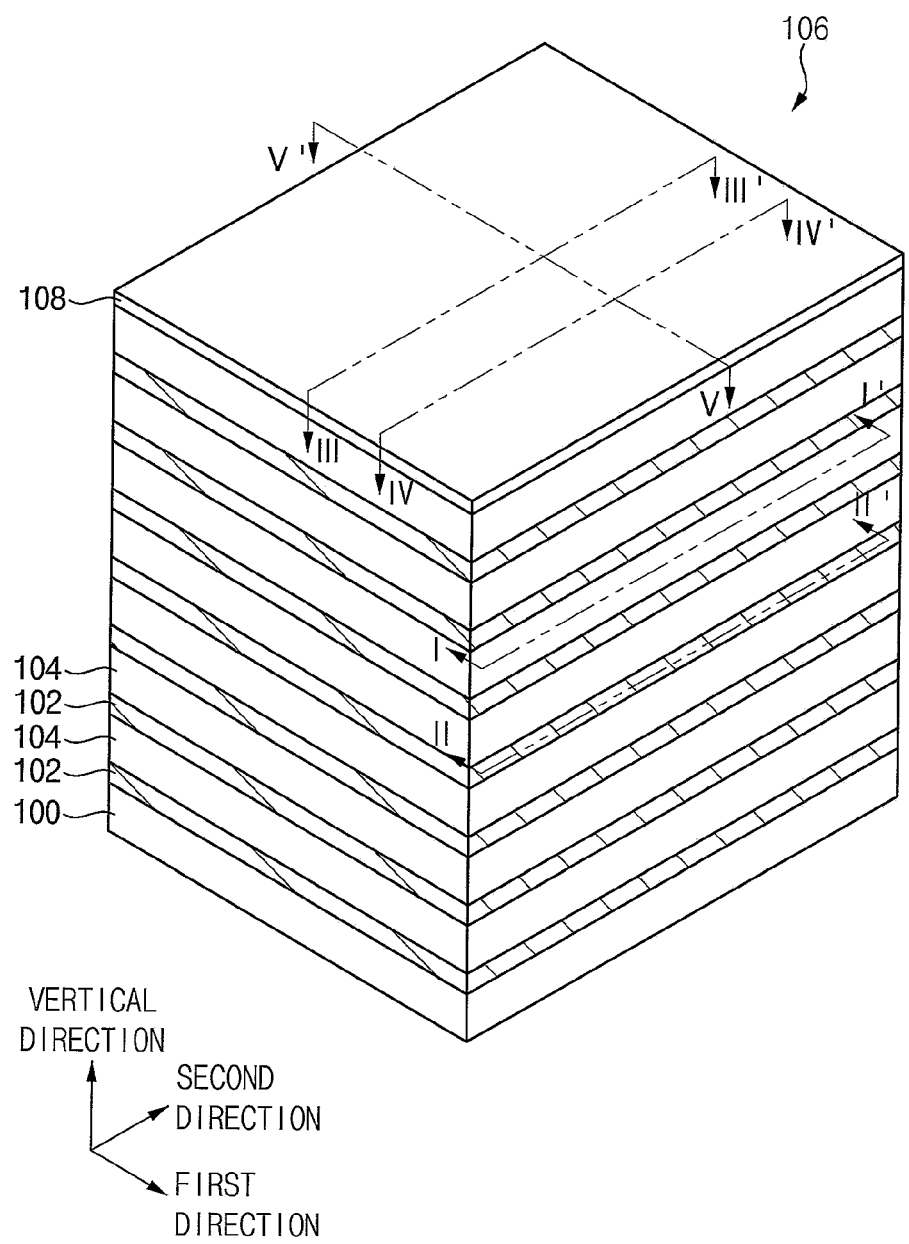
Figure 12:
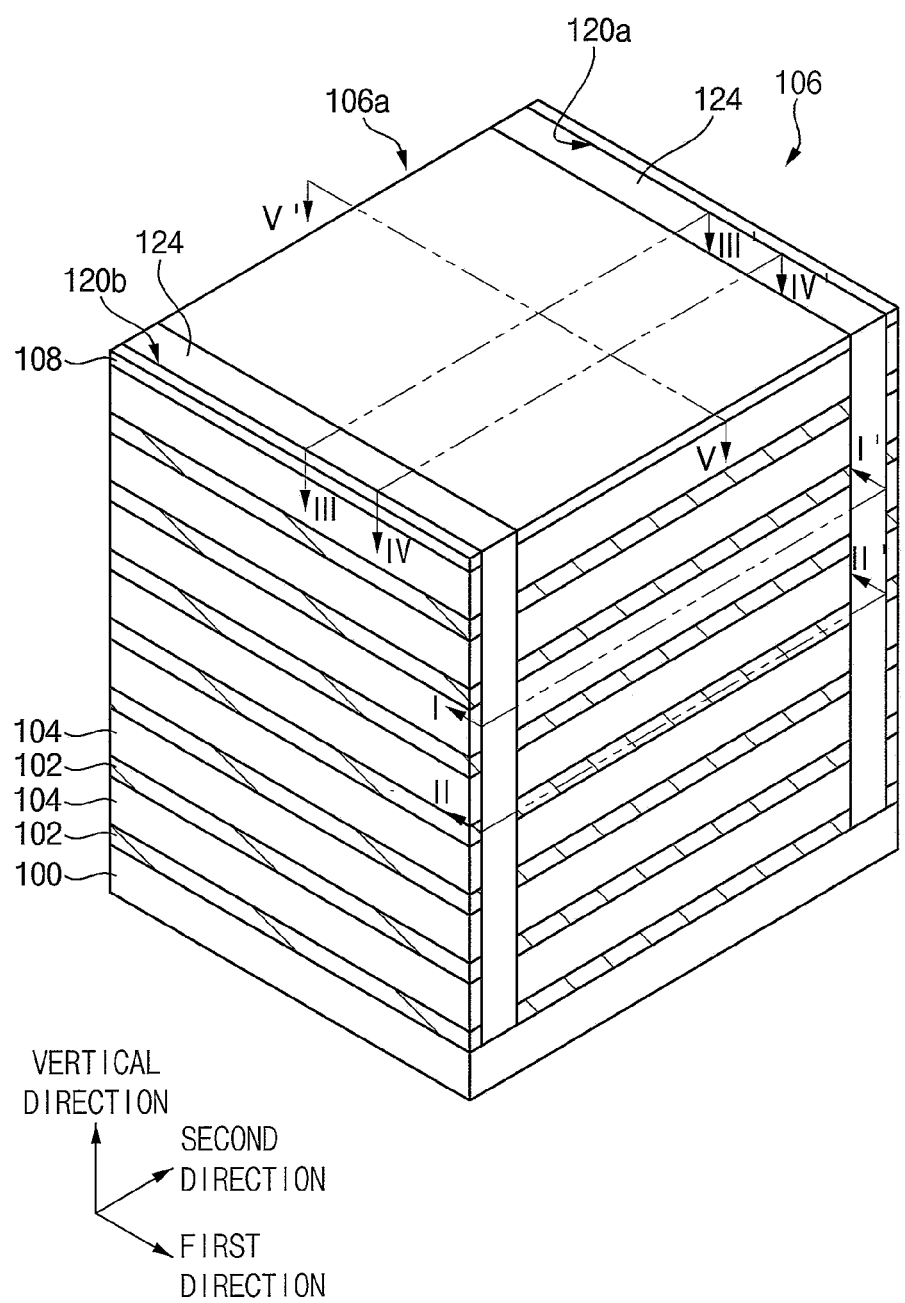
Figure 14:
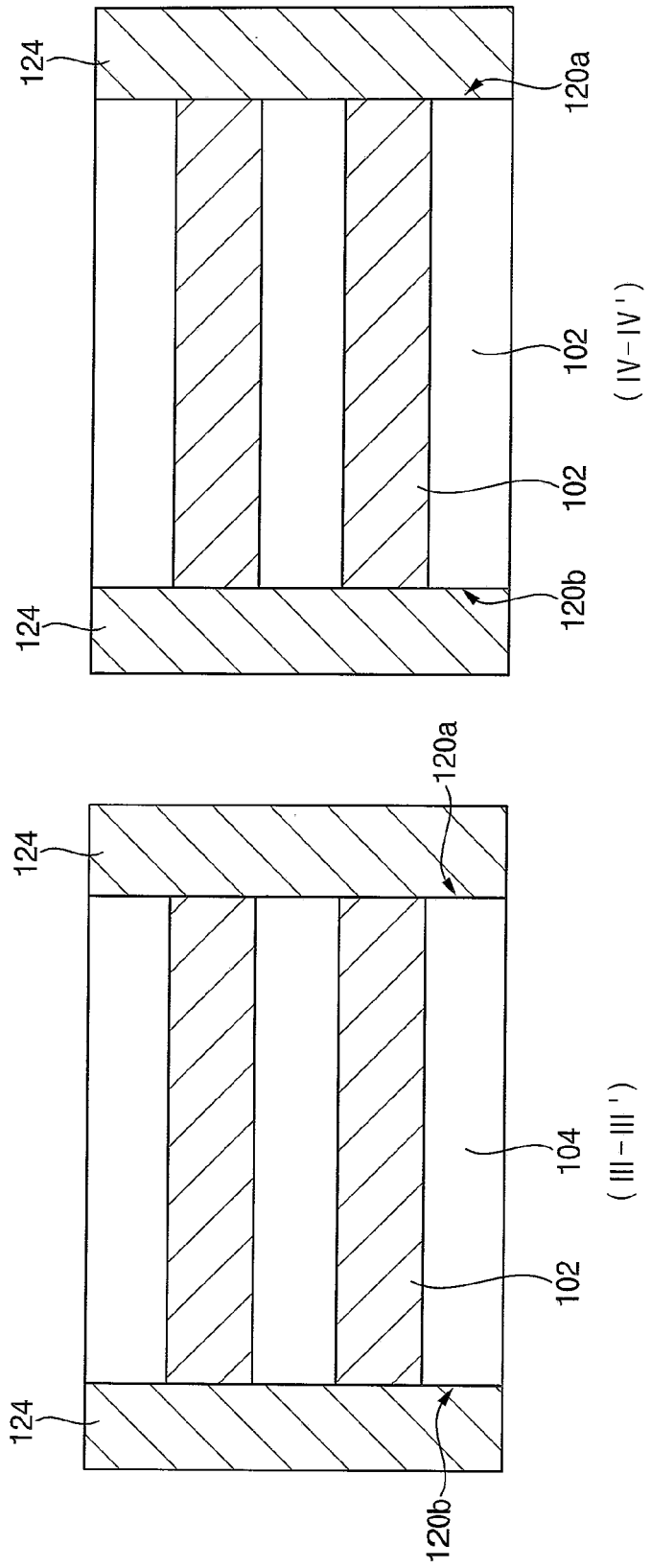
Figure 15:
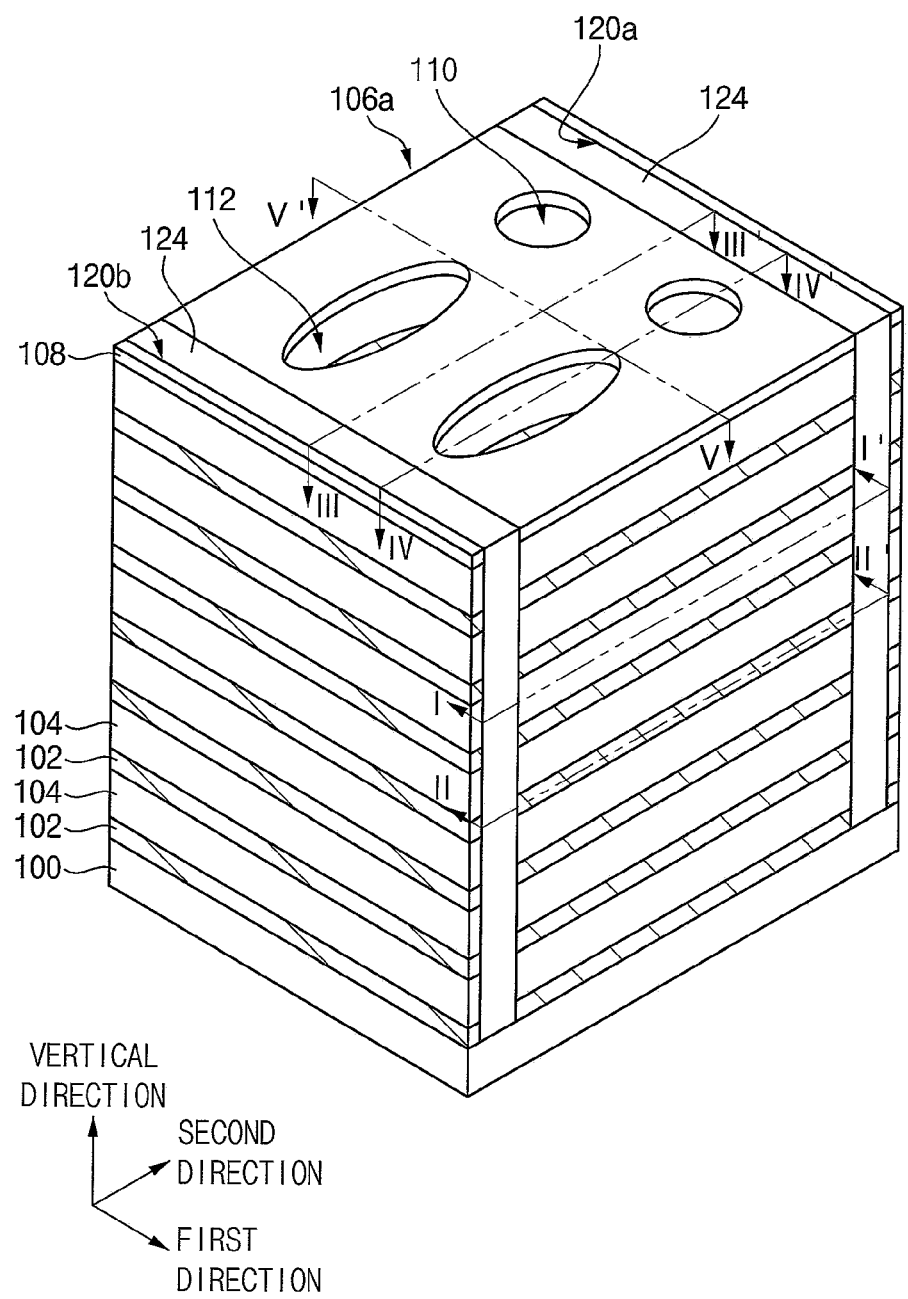

FIGS. 11, 12 and 15 are perspective views. FIGS. 13, 16, 18, 20, 22, 26, 29, 31, 33, 36 and 38 are cross-sectional views taken along I-I' and II-II' of FIGS. 11, 12 and 15. FIGS. 14, 17, 19, 21, 23, 27, 30, 32, 34, 37, 37, 39 and 40 are cross-sectional views taken along III-III' and IV-IV' of FIGS. 11, 12 and 15. FIGS. 24, 25, 28 and 35 are cross-sectional views taken along V-V of FIGS. 11, 12 and 15.

FIGS. 13, 16, 18, 20, 22, 26, 29, 31, 33, 36 and 38 are plan views of regions of a silicon layer and a sacrificial layer. FIGS. 14, 17, 19, 21, 23, 27, 30, 32, 34, 37, 39 and 40 are vertical cross-sectional views of regions of a silicon pattern and a pillar insulation pattern. FIGS. 24, 25, 28 and 35 are vertical cross-sectional views of a region of a word line.

Referring to FIG. 11, a sacrificial layer 102 and a silicon layer 104 may be alternately repeatedly stacked on a silicon substrate 100.

The silicon substrate 100 may include or may be a single crystal silicon substrate. The silicon substrate 100 may be a silicon substrate having a (100) crystal orientation.

The sacrificial layer 102 and the silicon layer 104 may be formed by an epitaxial growth process. The silicon layer 104 may be single crystal silicon. The sacrificial layer 102 may serve as a layer for forming the silicon layer having single crystal silicon. In example embodiments, a thickness of the silicon layer 104 may be greater than a thickness of the sacrificial layer 102. The sacrificial layer may include or may be, for example, a silicon germanium layer.

An uppermost layer of a stacked layer including the silicon layers 104 and the sacrificial layers 102 may be the silicon layer 104. A capping layer 108 may be further formed on the uppermost silicon layer to cover the upper most silicon layer. The capping layer 108 may include or may be silicon nitride.

Accordingly, a preliminary stacked structure 106 including the sacrificial layers 102 and the silicon layers 104 alternately stacked and the capping layer 108 thereon may be formed on the silicon substrate 100.

Figure 13:
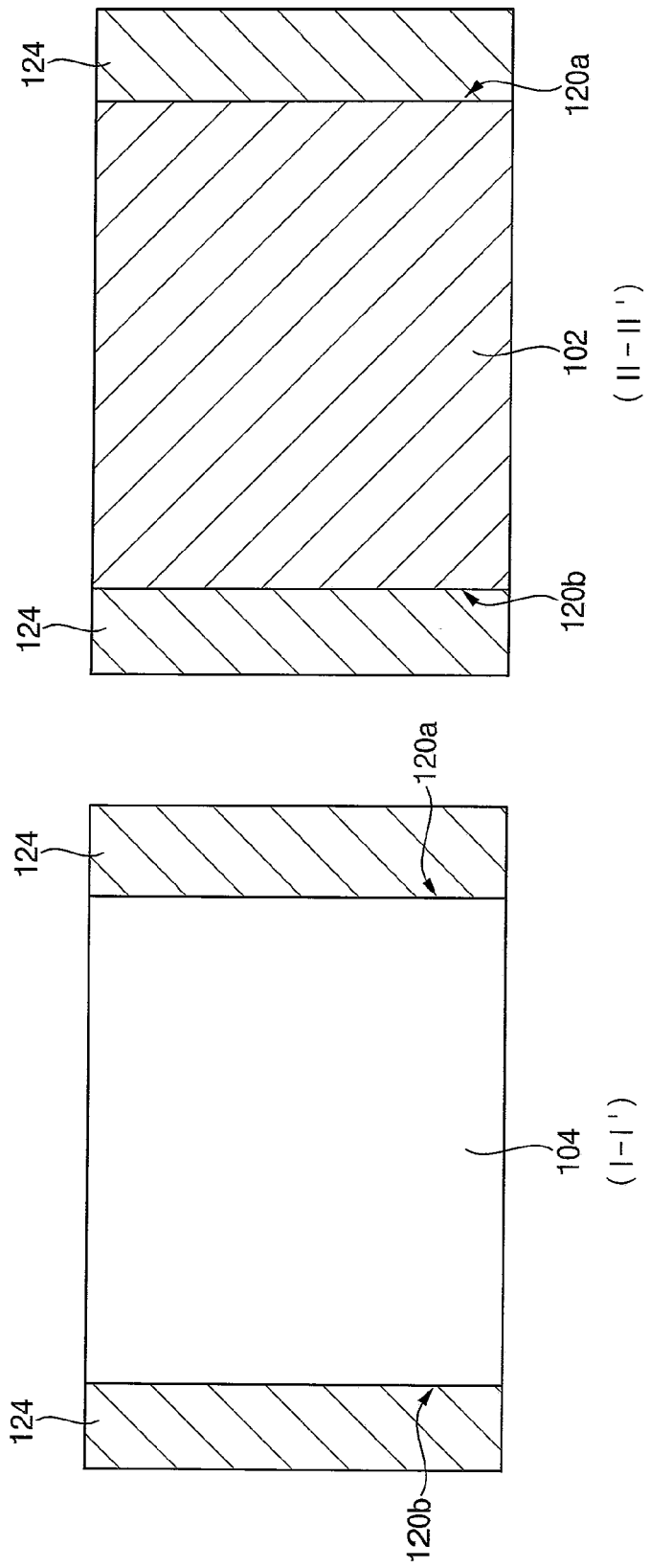

Referring to FIGS. 12 to 14, portions of the preliminary stacked structure 106 may be etched to form a first trench and a second trench extending in the first direction. The first and second trench may pass through the preliminary stacked structure 106 to expose an upper surface of the silicon substrate 100. The preliminary stacked structure 106 may be separated into portions separate from each other by the first and second trenches 120*a* and 120*b*, so that a stacked structure 106*a* extending in the first direction may be formed on the silicon substrate 100.

A trench including a first sidewall of the stacked structure 106*a* is referred to as the first trench 120*a*, and a trench including a second sidewall opposite the first sidewall of the stacked structure 106*a* is referred to as the second trench 120*b*.

A first filling insulation pattern 124 may be formed on sidewalls and bottom of the first and second trenches 120*a* and 120*b* to fill the first and second trenches 120*a* and 120*b*. The first filling insulation pattern 124 may include or may be formed of at least one of silicon nitride and silicon oxide.

Figure 16:
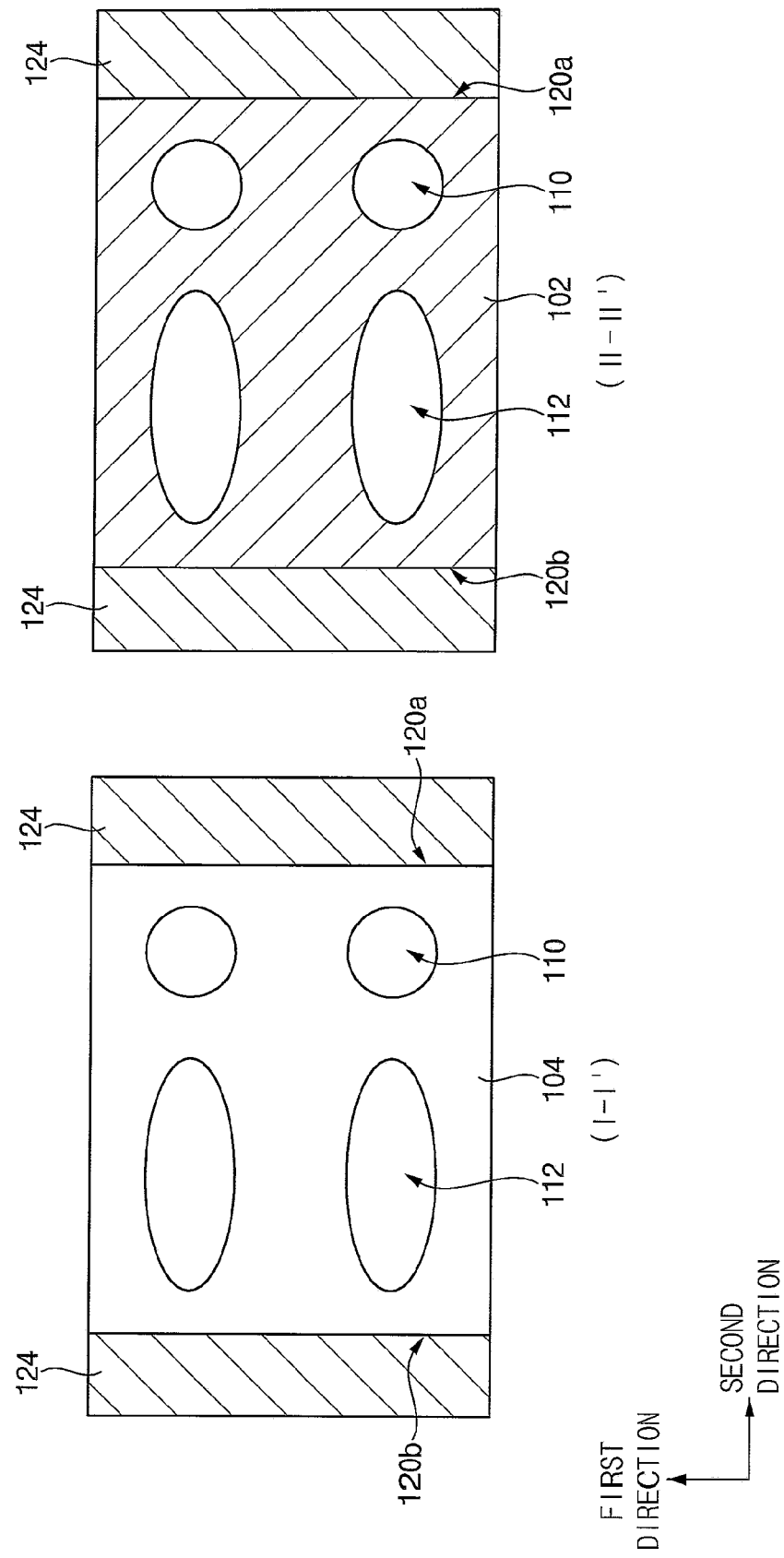
Figure 17:
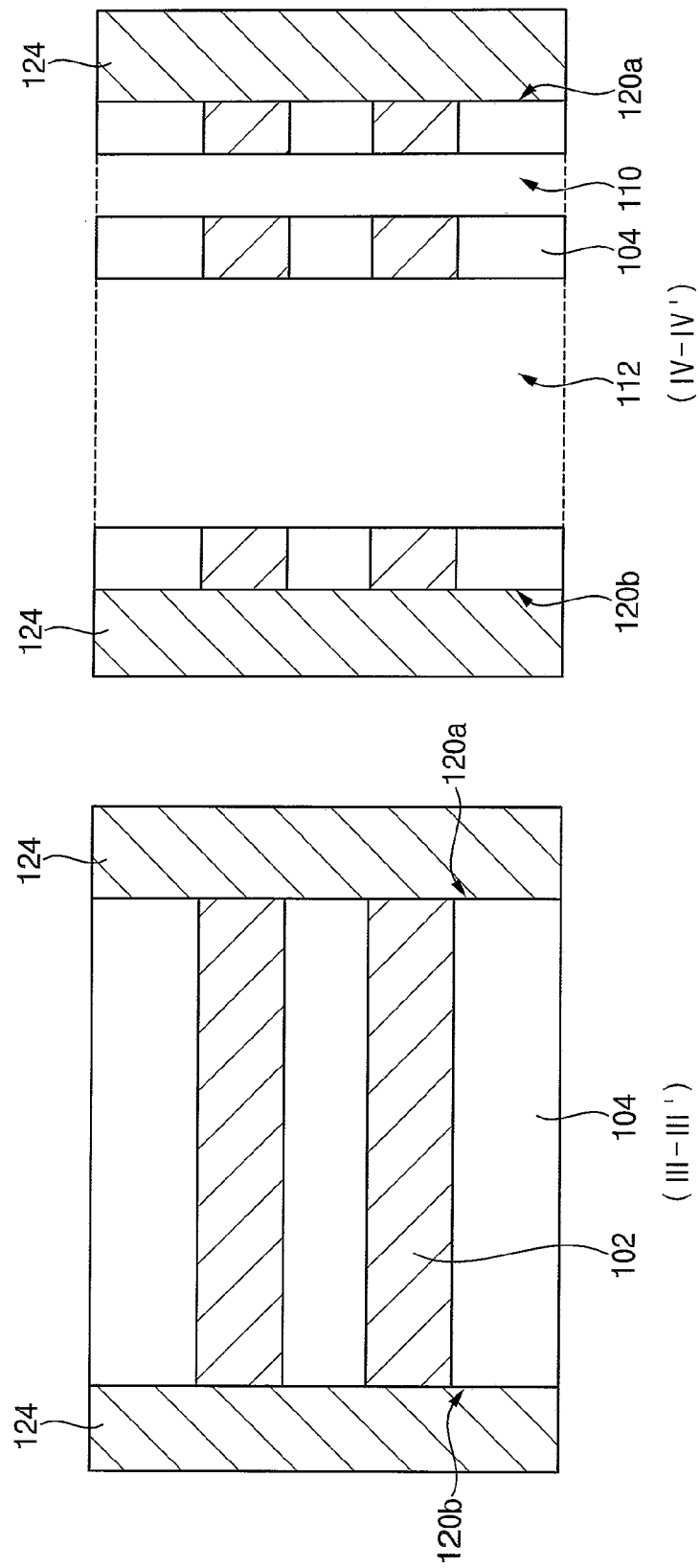

Referring to FIGS. 15 to 17, portions of the stacked structure 106*a* may be etched to form first openings 110 and second openings 112. The first and second openings may pass through the stacked structure 106*a* to expose the upper surface of the silicon substrate 100.

Each of the first openings 110 may have a hole shape having a first inner width. The first openings 110 may be spaced apart from each other in the first direction, and may be aligned in a straight line in the first direction.

Each of the second openings 112 may have a hole shape having a second inner width greater than the first inner width. Each of the second openings 112 may have a shape in which a width in the second direction is longer than a width in the first direction. The second openings 112 may be spaced apart from each other in the first direction, and may be aligned in a straight line in the first direction.

The first and second openings 110 and 112 may be spaced apart from each other, and may be may be aligned in the second direction.

According to a top shape of the first and second openings 110 and 112, shapes of sidewalls of a word line subsequently formed may be changed. According to the top shape of the first and second openings 110 and 112, top shapes (e.g., as seen from a plan view) of the first pillar insulation pattern and the second pillar insulation pattern subsequently formed may be changed.

For example, in a plan view, an upper portion of the first opening 110 may have a circular shape, and an upper portion of the second opening 112 may have an oval (e.g., elliptical) shape having a longer width in the second direction.

For another example, in a plan view, upper portions of the first opening and the second opening may have a rectangular shape having rounded vertices. In this case, the three-dimensional semiconductor memory device shown in FIG. 10 may be formed by subsequent processes.

Through the subsequent processes, one memory cell may be formed at the silicon layer 104 of each layer in a region between two adjacent first openings 110 and two second openings 112.

The silicon layers 104 and the sacrificial layers 102 in the stack structure 106*a* may be exposed by sidewalls of each of the first and second openings 110 and 112.

Figure 18:
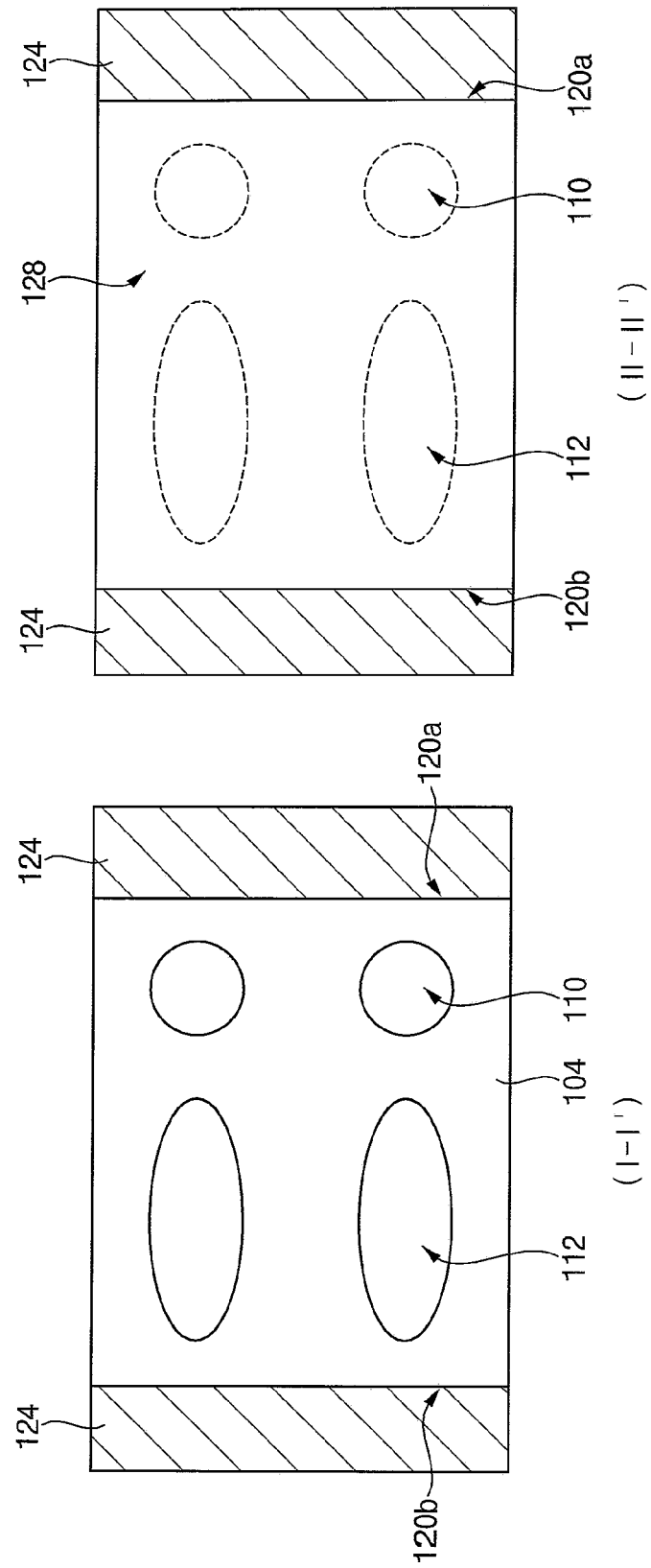
Figure 19:
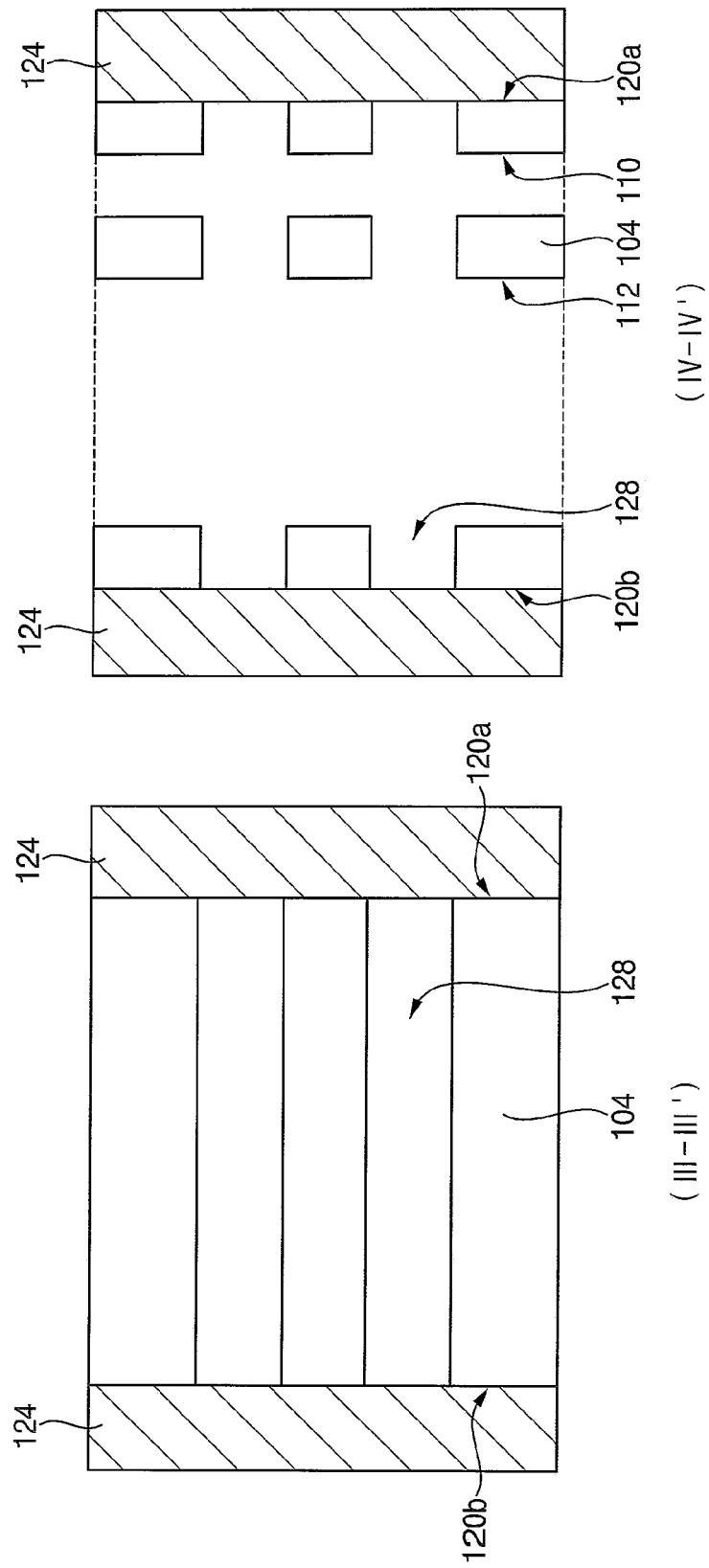

Referring to FIGS. 18 and 19, the sacrificial layer 102 of each layer exposed by the first and second openings 110 and 112 may be selectively removed. The sacrificial layer 102 may be removed by an isotropic etching process to form a first gap 128. The first gap 128 may be formed at a position where the sacrificial layer 102 is formed.

The silicon layer 104 may be exposed by sidewalls of the first and second openings 110 and 112 and upper and lower surfaces of the first gap 128.

Figure 20:
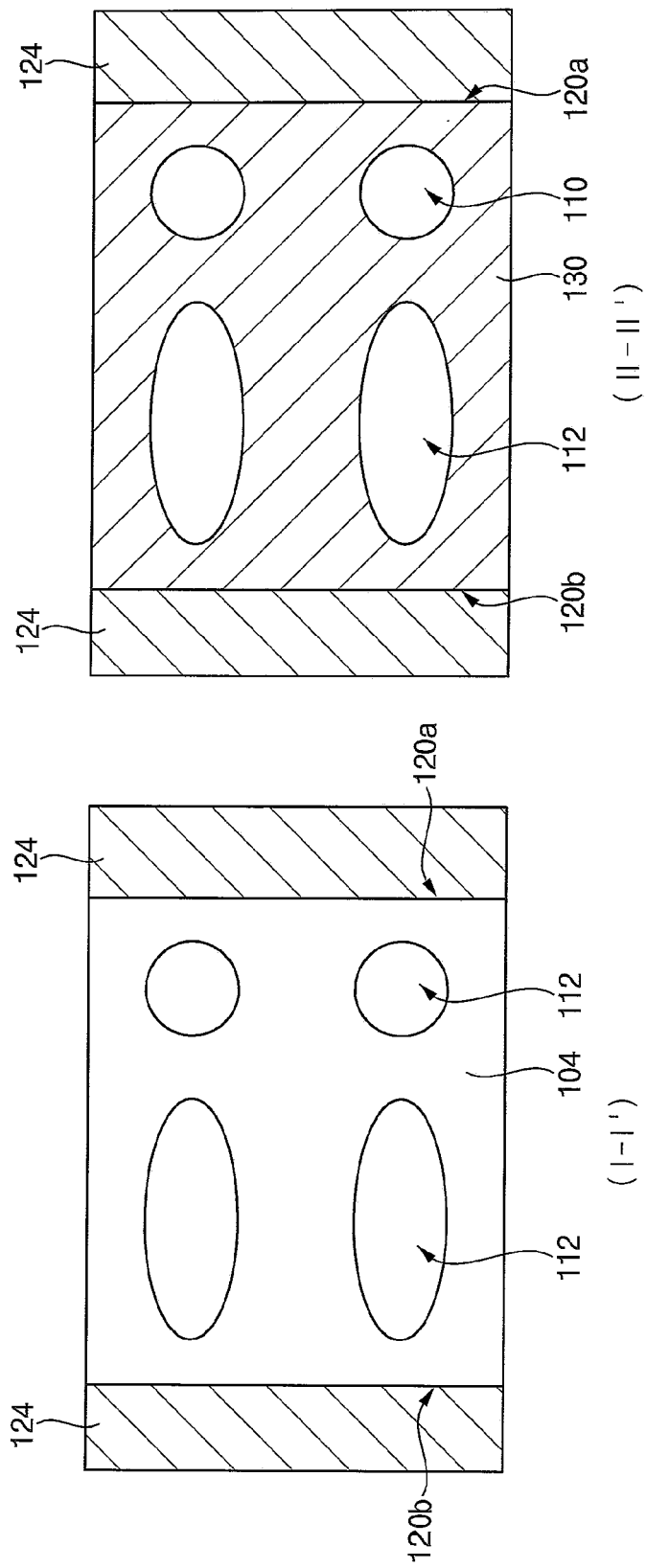
Figure 21:
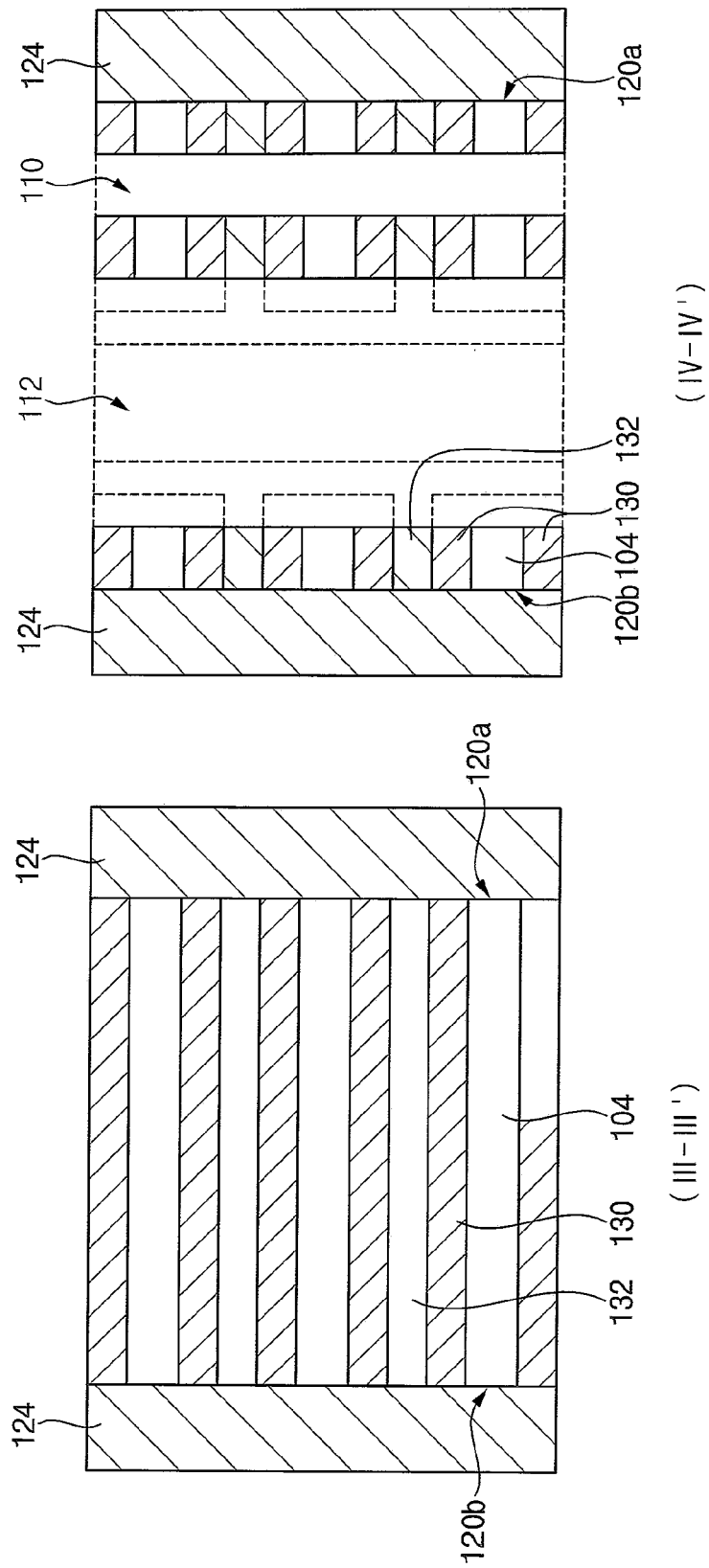

Referring to FIGS. 20 and 21, a second filling insulation layer may be conformally formed on the sidewalls and bottom of the first and second openings 110 and 112, surfaces of the first gap 128, and the stacked structure. The second filling insulation layer may include or may be silicon nitride. The second filling insulation layer may be formed on each of the upper surface and the lower surface of the first gap 128, and may not completely fill the first gap 128. A portion of the second filling insulation layer may be replaced with a word line by subsequent processes.

A third filling insulation layer may be formed on the second filling insulation layer. The third filling insulation layer may be conformally formed along the sidewalls of the first and second openings 110 and 112, and may completely fill the first gap 128. The third filling insulation layer may include or may be silicon oxide.

Thereafter, the third and second filling insulation layers formed on the sidewalls and bottom of the first and second openings 110 and 112 and the stacked structure may be removed to form a second filling insulation pattern 130 and a third filling insulation pattern 132. The second filling insulation pattern 130 and the third filling insulation pattern 132 may fill the first gap 128. The third filling insulation pattern 132 may be interposed between the second filling insulation patterns 130 in the first gap 128.

According to the above process, the silicon layer 104 of each layer may be exposed by the sidewalls of the first and second openings 110 and 112.

Figure 22:
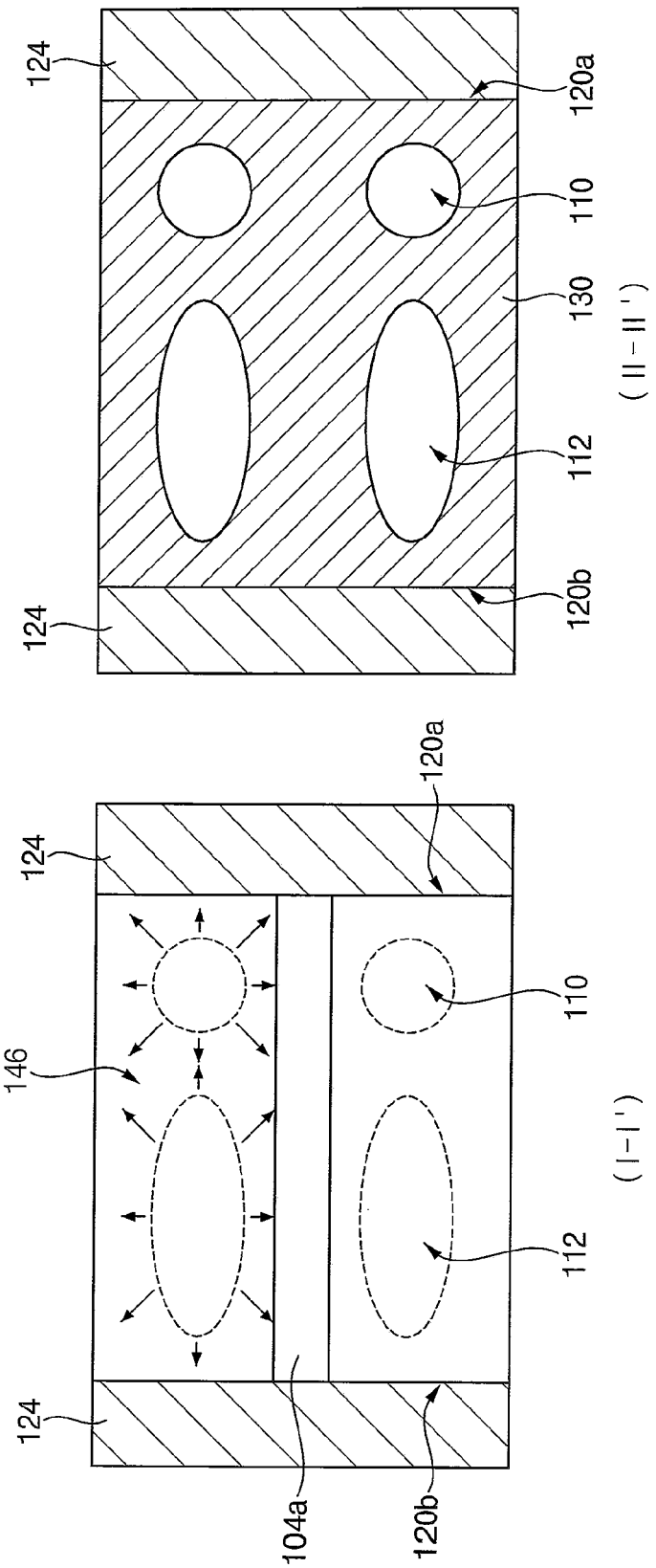
Figure 23:
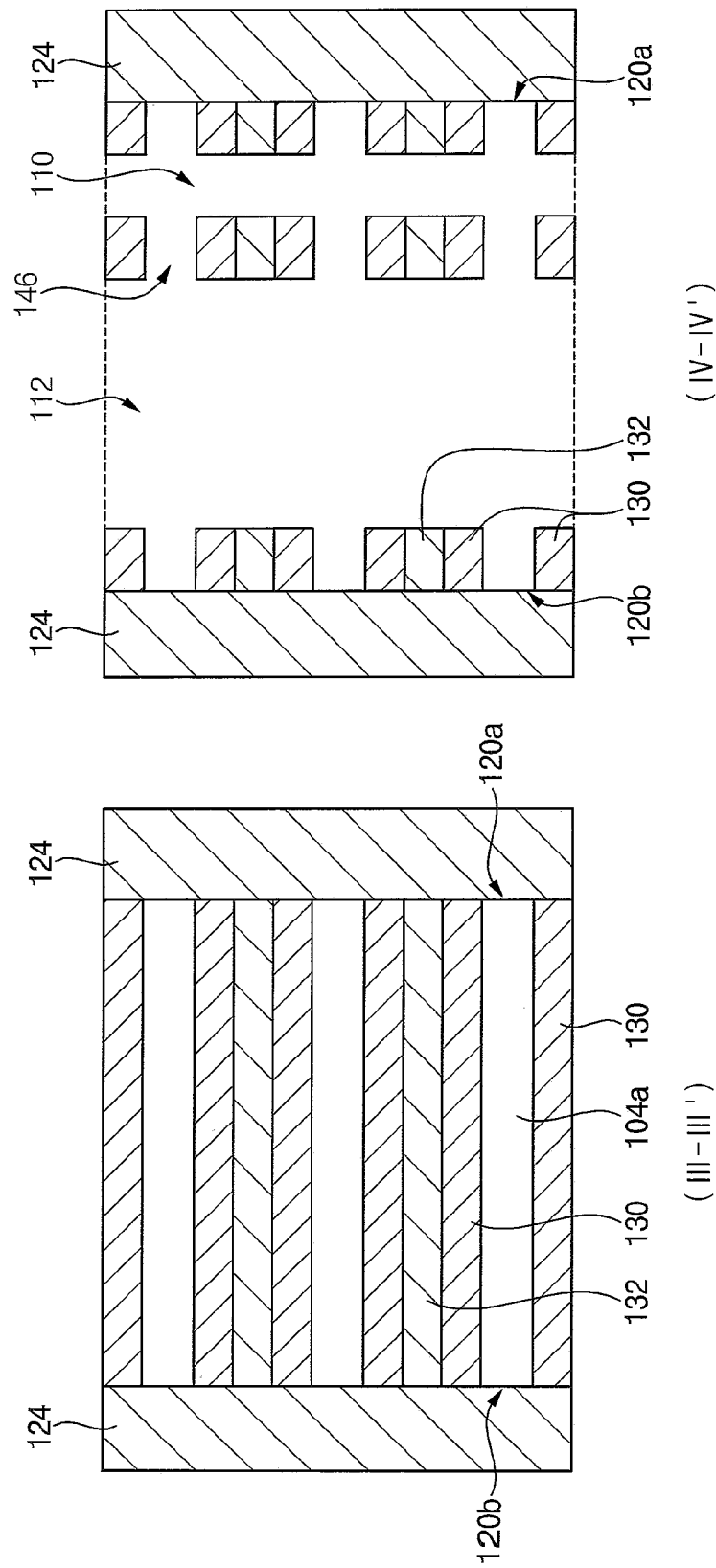

Referring to FIGS. 22 and 23, a portion of the silicon layer 104 exposed by the sidewalls of the first and second openings 110 and 112 may be etched to form a silicon pattern 104*a*. The silicon layer 104 may be laterally etched from the sidewalls the first and second openings 110 and 112. The etching process of the silicon layer 104 may be an anisotropic etching process.

The anisotropic etching process may be performed using an etching chemical or an etching gas having a different etching rate according to a crystal structure of an exposed surface of the silicon layer 104. For example, the anisotropic process may have a high etch rate at a specific exposed surface of the silicon layer 104. In the anisotropic etching process, the second filling insulation pattern 130 and the third filling insulation pattern 132 may be hardly etched.

The silicon layer 104 may have different crystal structures depending on positions of the silicon layer 104 exposed by the sidewalls of the first and second openings 110 and 112. Therefore, the etching rate of the silicon layer 104 may be different depending on the positions of the silicon layer 104. The silicon layer 104 may not be etched along sidewall profiles of the first and second openings 110 and 112, so that the silicon pattern 104a may have a shape different from shapes of the sidewall profiles of the first and second openings 110 and 112.

The silicon layer 104 may be anisotropically etched from the sidewalls of the two adjacent first openings 110 and the sidewalls the two adjacent second openings 112.

In a plan view, the silicon pattern 104a formed by the etching process may be formed in a region between the two adjacent first openings 110 and the two adjacent second openings 112. For example, in the etching process, a portion of the silicon layer 104 between the two adjacent first openings 110 facing each other in the first direction and between the two adjacent second openings 112 facing each other in the first direction may be etched to have relatively low etching rate. On the other hand, a portion of the silicon layer 104 between the first and second openings 110 and 112 may be etched to have relatively high etching rate.

Accordingly, the silicon pattern 104a formed by the etching process may have a line shape in which the second direction is a longitudinal direction. In the plan view, both sidewalls in the first direction of the silicon pattern 104a may have a substantially straight line shape. The silicon pattern 104a may serve as an active pattern of a memory cell. Since the both sidewalls in the first direction of the silicon pattern 104a may have the straight line shape, an upper surface of the silicon pattern 104a may have no region in which an area of the silicon pattern 104a is locally increased or decreased. Therefore, electrical characteristics of unit devices (e.g., transistors) formed on the silicon pattern 104a may be uniform.

In example embodiments, as shown in FIG. 24, in the cross-sectional view, the sidewalls in the first direction of the silicon pattern 104a may have a concave portion. As the etch rate of the silicon layer 104 may be different depending on a vertical position thereof, the sidewalls in the first direction of the silicon pattern 104a may not be vertical.

Figure 25:
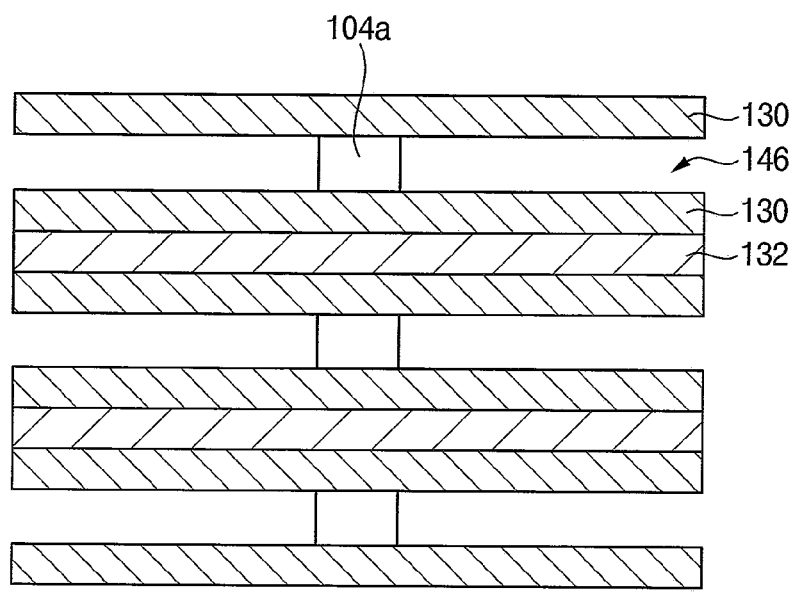

In some example embodiments, as shown in FIG. 25, in the cross-sectional view, the sidewalls in the first direction of the silicon pattern 104a may be vertical without the concave portion. After the silicon layer is anisotropically etched, a post-etching process for removing the concave portion of the sidewalls of the silicon pattern may be further performed.

In some example embodiments, a pre-treatment process may be further performed before etching of the silicon layer.

Second gaps 146 may be formed at both sides of the silicon pattern 104a.

Figure 26:
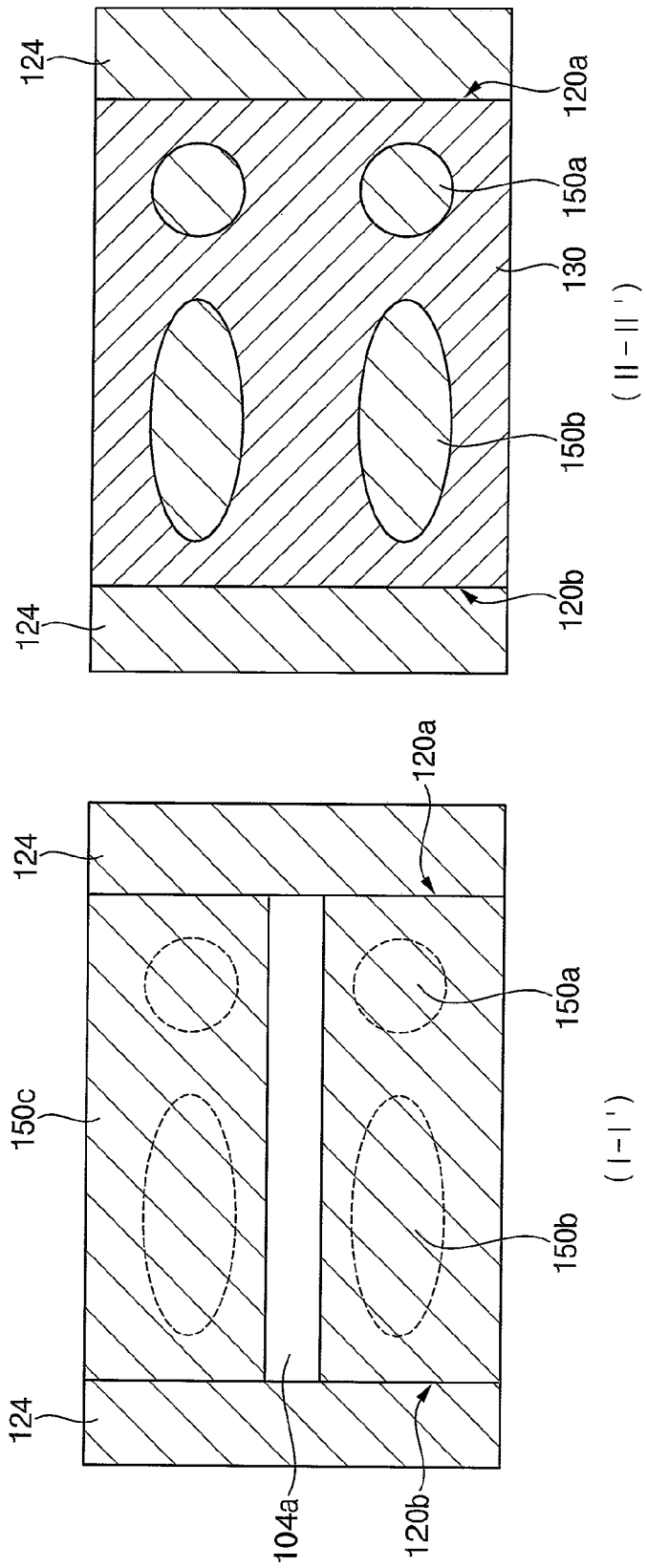
Figure 27:
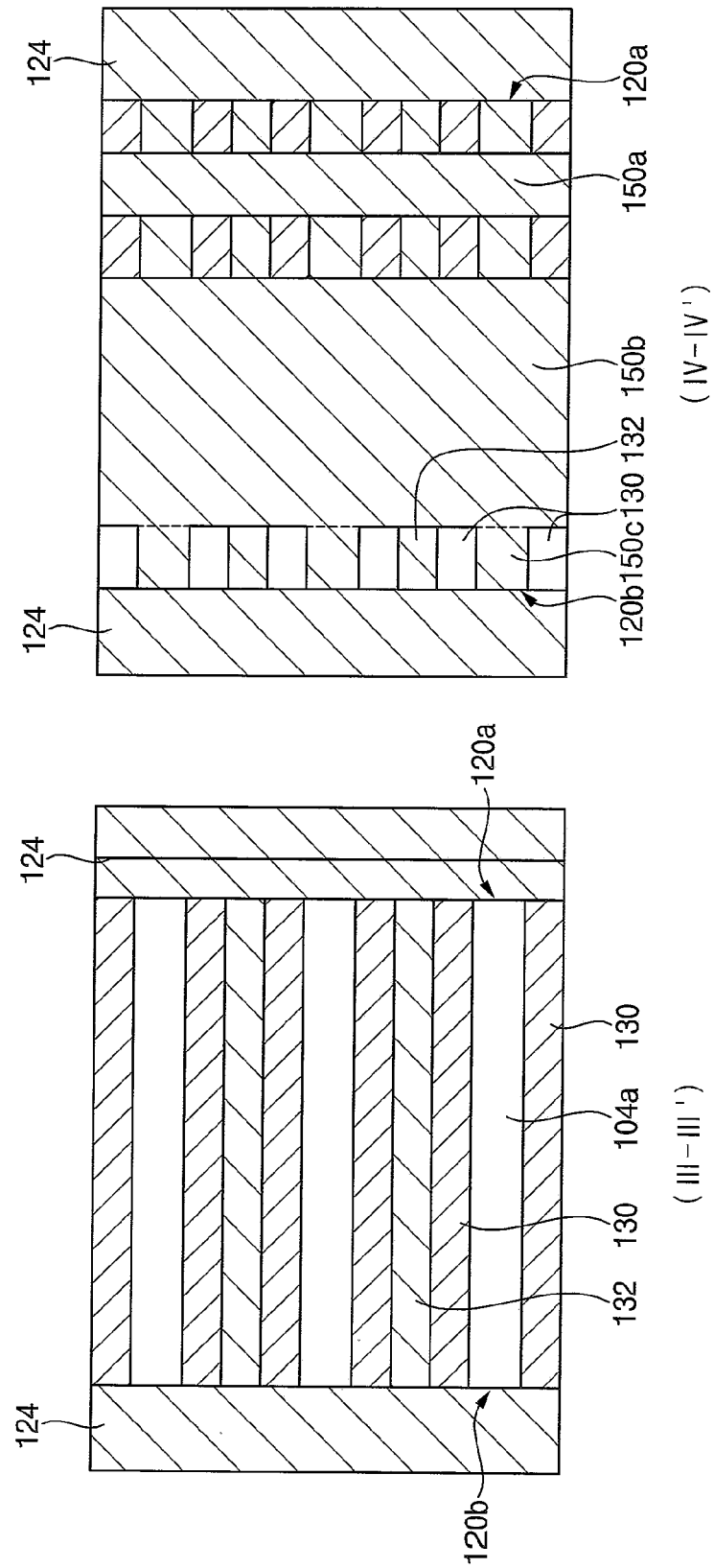
Figure 28:
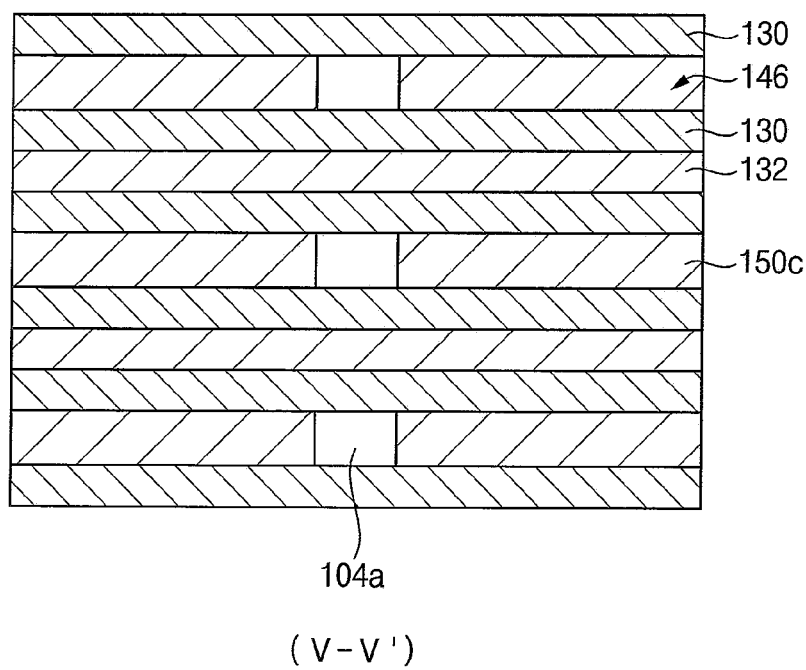

Referring to FIGS. 26 to 28, a filling insulation layer may be formed on the stack structure to fill the first and second openings 110 and 112 and the second gap 146. The filling insulation layer may be planarized to form a filling insulation pattern in the first and second openings 110 and 112 and the second gap 146. The filling insulation pattern may include or be formed of silicon oxide. Hereinafter, the filling insulation pattern formed in the first opening 110 is referred to as a first pillar insulation pattern 150a, and the filling insulation pattern formed in the second opening 112 is referred to as a second pillar insulation pattern 150b. The filling insulation pattern formed in the second gap 146 is referred to as a fourth filling insulation pattern 150c. The fourth filling insulation pattern 150c may be formed on the both (e.g., opposite) sidewalls of each layer of the silicon pattern 104a, respectively.

Figure 29:
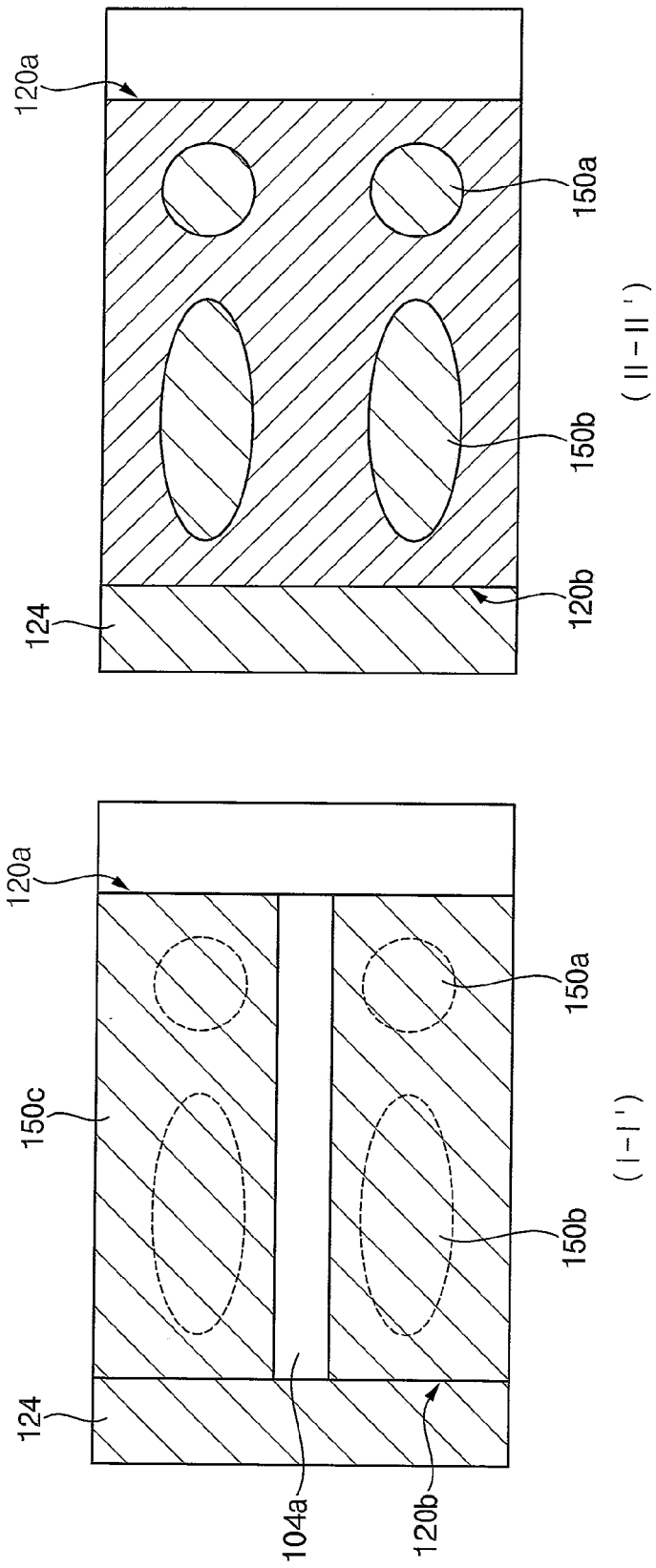
Figure 30:
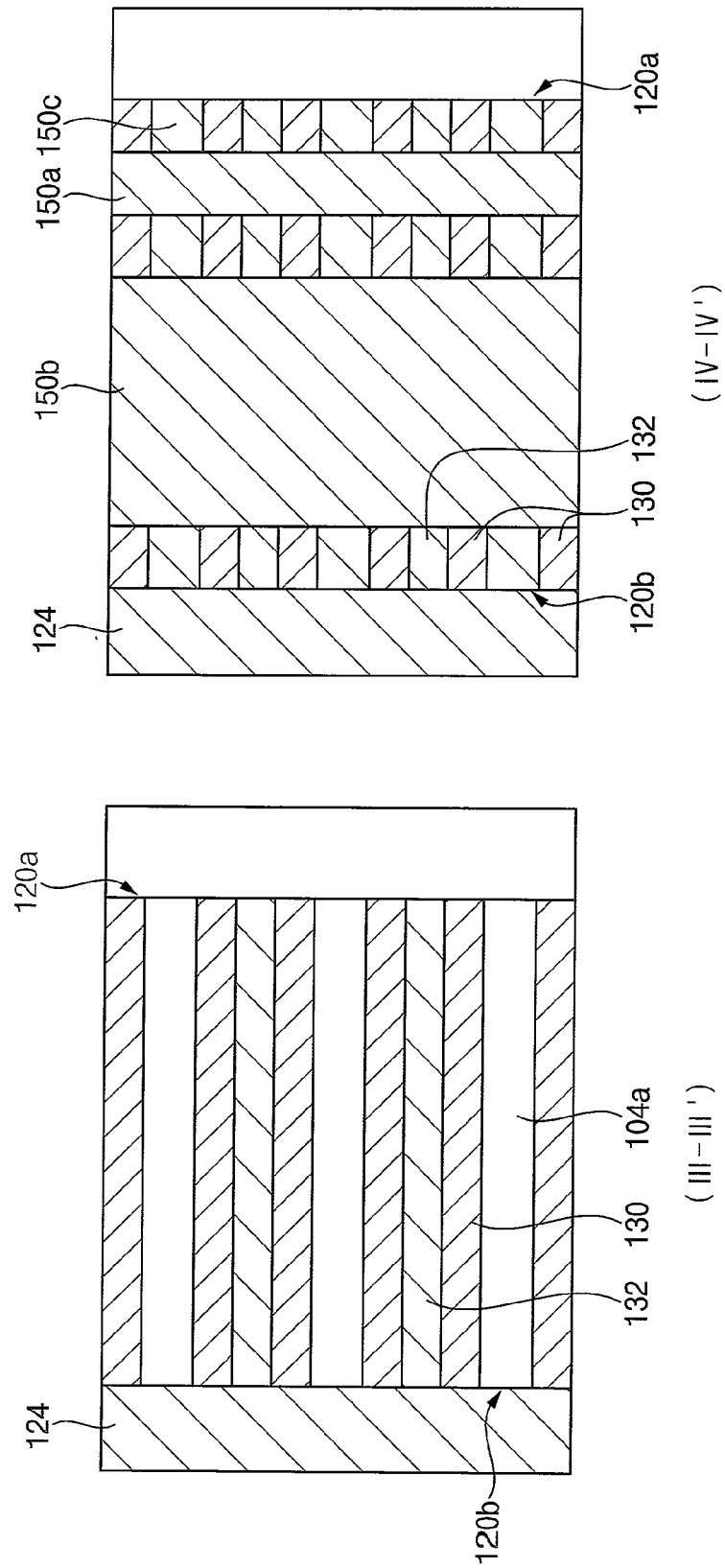

Referring to FIGS. 29 and 30, the first filling insulation pattern 124 filling the first trench 120a may be removed. Accordingly, the second filling insulation pattern 130, the third filling insulation pattern 132, the fourth filling insulation pattern 150c and the silicon pattern 104a may be exposed by the sidewalls of the first trench 120a.

Figure 31:
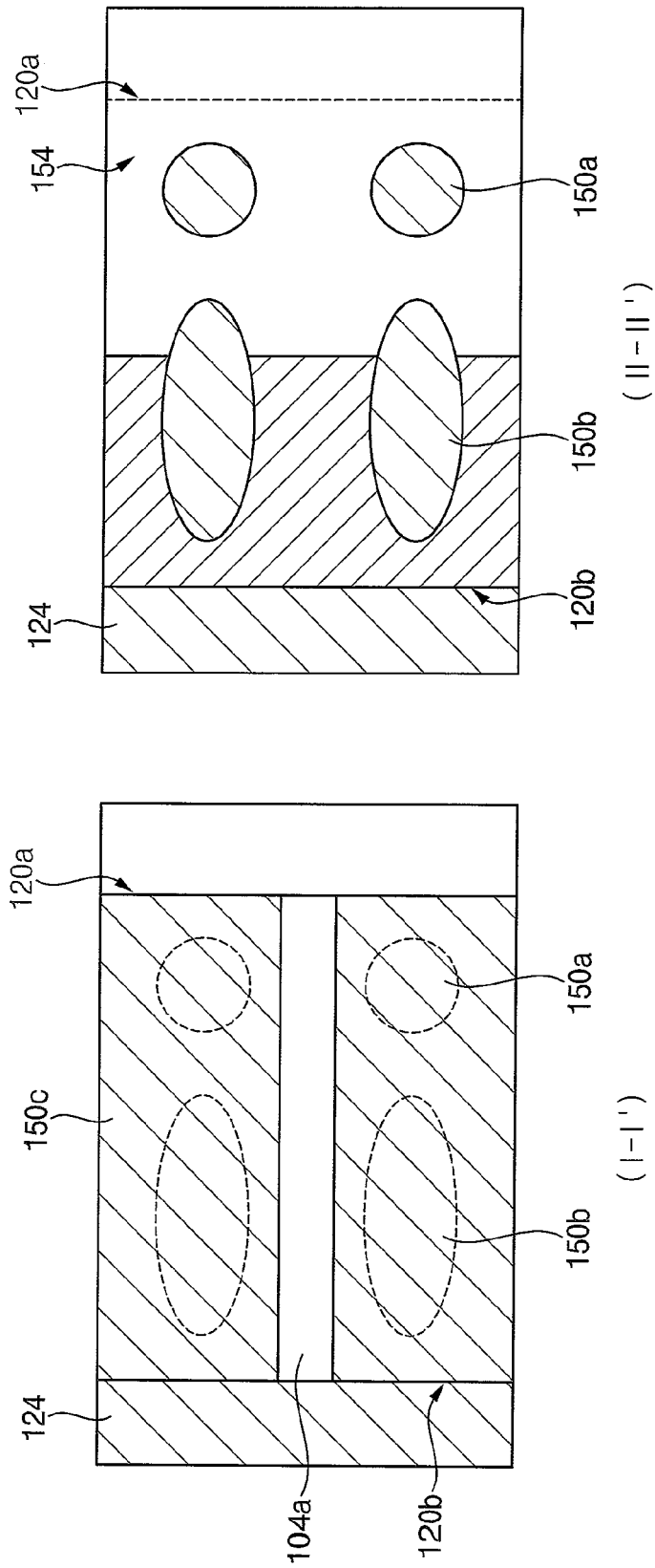
Figure 32:
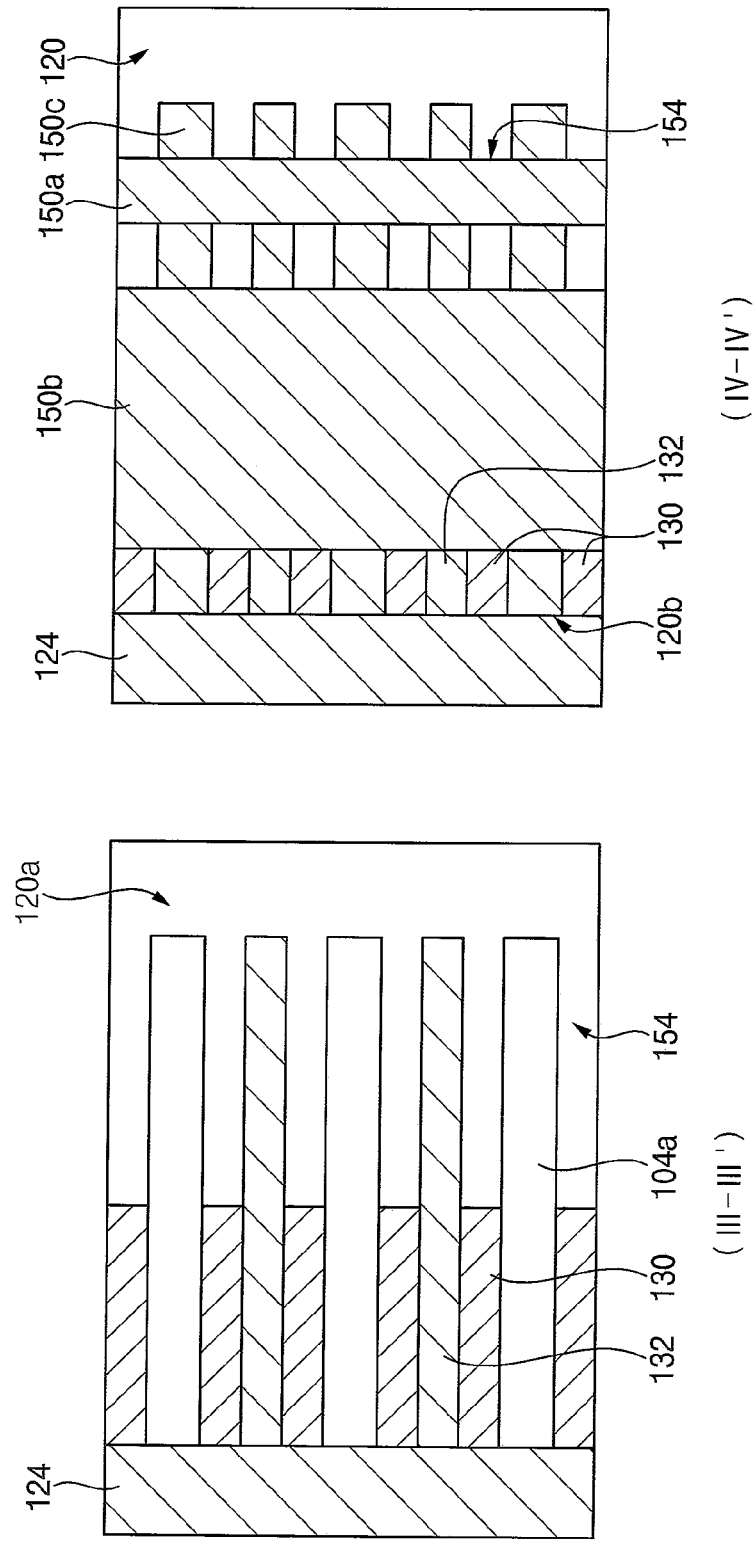

Referring to FIGS. 31 and 32, a portion of the second filling insulation pattern 130 may be selectively removed to form a third gap 154. The third gap 154 may be formed at a portion where the second filling insulation pattern 130 is removed.

The third gap 154 may define a region for forming a word line in subsequent processes. That is, one end in the second direction of the third gap 154 may be at the same position as one end in the second direction of the word line.

In example embodiments, in the etching process, the portion of the second filling insulation pattern 130 may be etched such that at least an entire surface of the first pillar insulation pattern 150a may be exposed by the third gap 154. Also, in the etching process, the portion of the second filling insulation pattern 130 may be removed such that a portion of the second pillar insulation pattern 150b may be exposed by the third gap 154.

In some example embodiments, in the etching process, the portion of the second filling insulation pattern 130 may be etched so that at least an entire surface of the first pillar insulation pattern 150a may be exposed by the third gap 154. However, after the etching process, the second pillar insulation pattern 150b may not be exposed by the third gap 154 or the third gap 154 may only contact a circumference of the outermost sidewall of the second pillar insulation pattern 150b.

Although not shown, a gate insulation layer may be conformally formed on the surface of the silicon pattern 104a exposed by the third gap 154.

Figure 33:
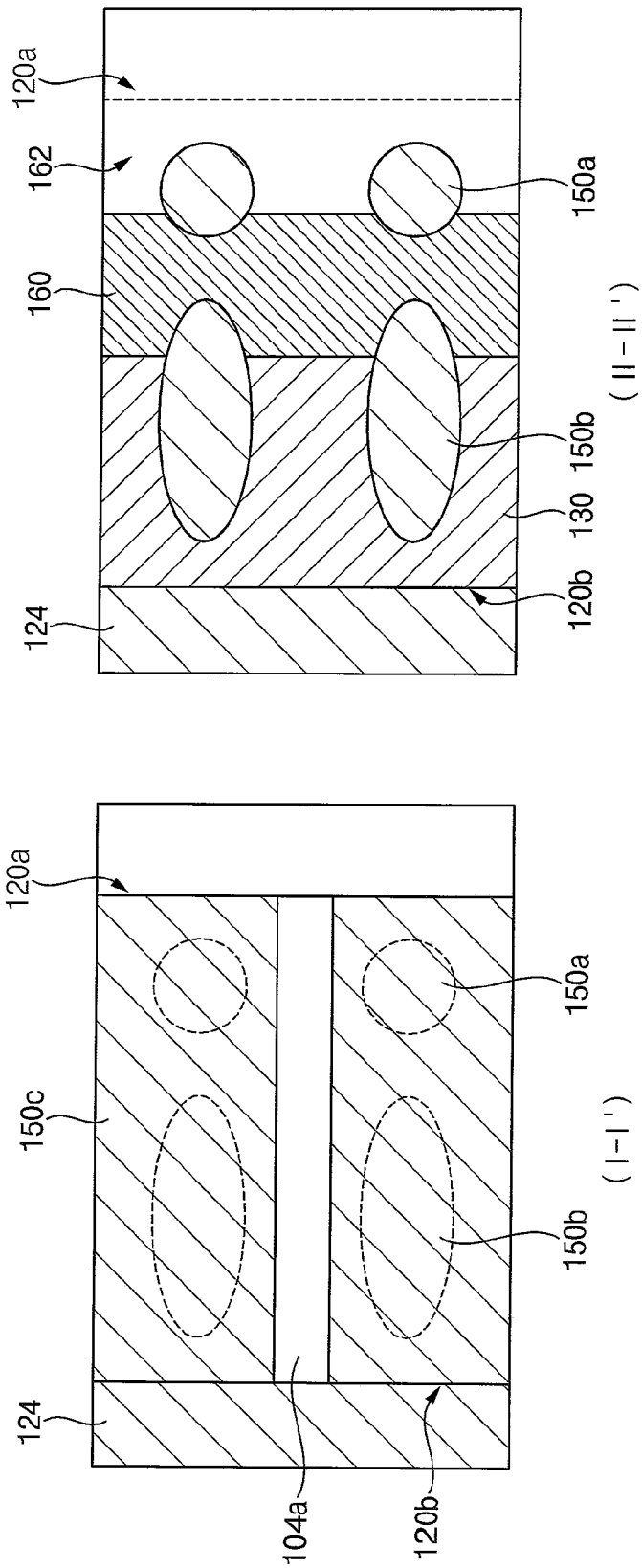
Figure 34:
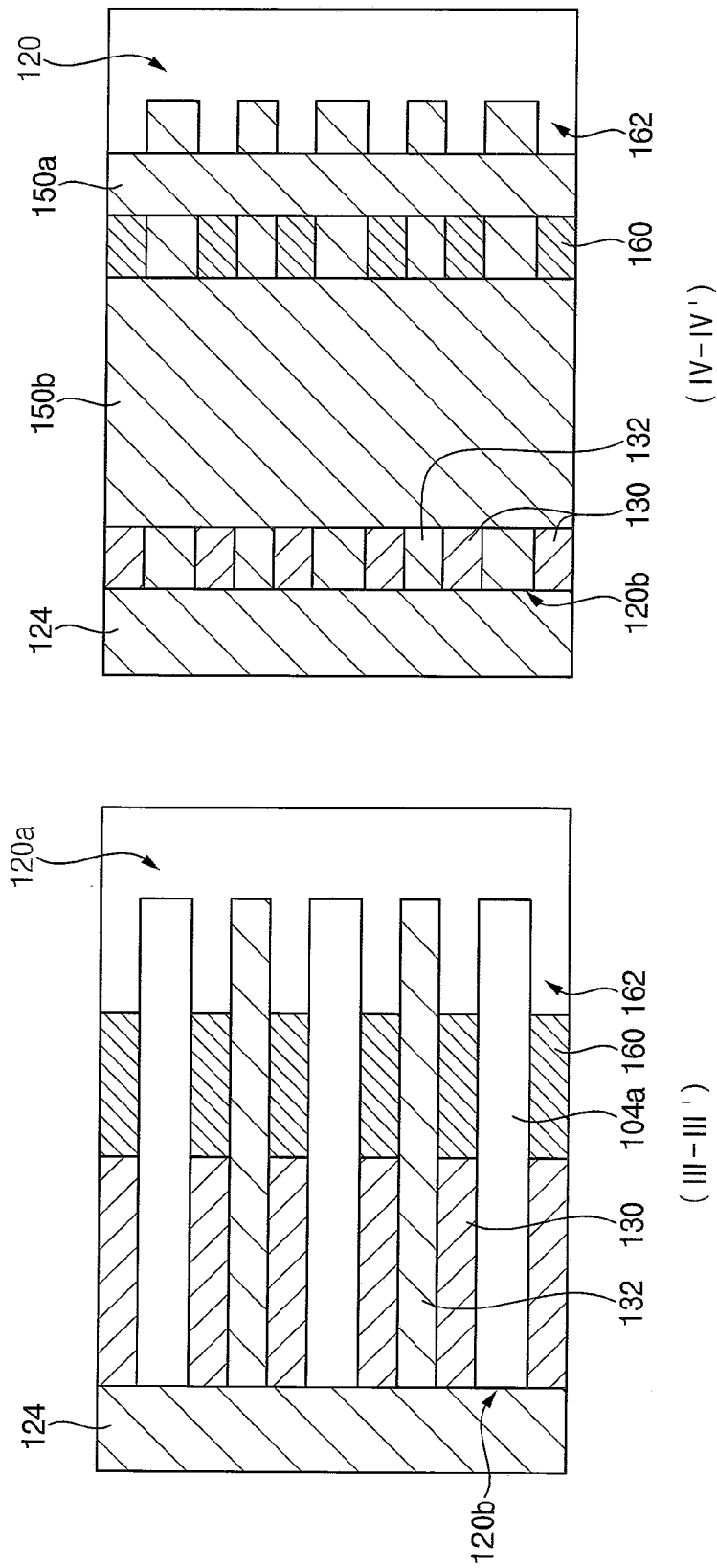
Figure 35:
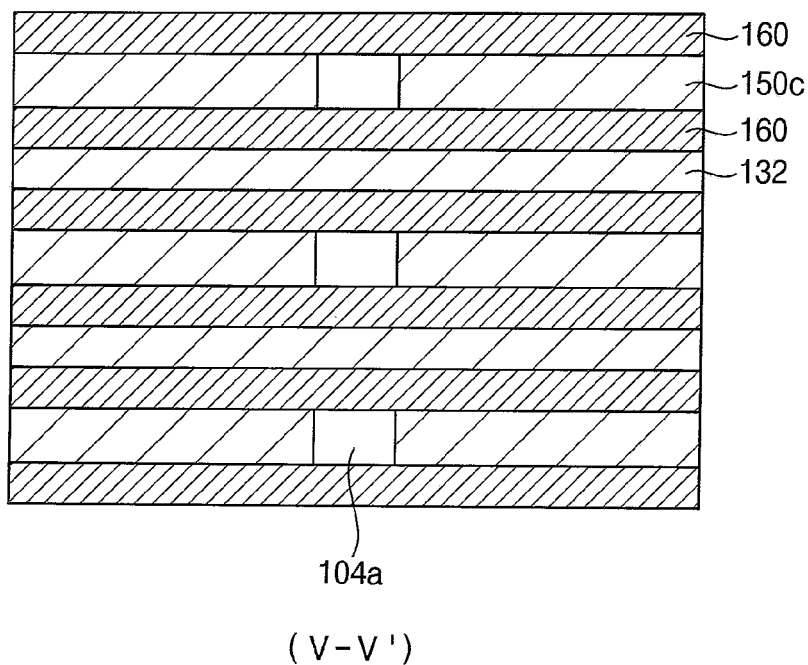

Referring to FIGS. 33 to 35, a conductive layer may be formed on the sidewall of the first trench 120a to fill the third gap 154. The conductive layer may include or may be a metal material, e.g., tungsten.

A portion of the conductive layer may be removed to form a word line 160 in the third gap 154. The removing process may include an isotropic etching process. In the removing process, the conductive layer formed on the sidewall of the first trench 120a may be completely removed, and a portion of the conductive layer in the third gap 154 adjacent to the sidewall of the first trench 120a may be partially removed to form a fourth gap 162. The fourth gap 162 may be formed at a sidewall of the word line 160.

The word line 160 may extend in the first direction. The word lines 160 may be formed on upper and lower surfaces of the silicon pattern 104a, respectively. The word line 160 may extend to cross the silicon pattern 104a.

In example embodiments, sidewalls in the second direction of the word line 160 may contact the first and second pillar insulation patterns 150a and 150b, respectively.

In a plan view, a portion of the sidewall of the word line 160 of each layer may be formed along sidewall profiles of the first and second pillar insulation patterns 150a and 150b.

In the plan view, the word line 160 may include a first portions that do not contact the first and second pillar insulation patterns 150a and 150b, second portions contacting the first pillar insulation pattern 150a, and third portions contacting the second pillar insulation patterns 150b. The first portions of the word line 160 may have a straight line shape extending in the first direction. Each of the second and third portions of the word line 160 may have a rounded shape. In example embodiments, a curvature of the second portion and a curvature of the third portion of the word line 160 may be different from each other.

Since the first pillar insulation patterns 150a are repeatedly disposed to be spaced apart from each other in the first direction, the second portions of the word line 160 may be repeatedly disposed to be spaced apart from each other in the first direction. Since the second pillar insulation patterns 150b are repeatedly disposed to be spaced apart in the first direction, the third portions of the word line 160 may be repeatedly disposed to be spaced apart from each other in the first direction. The second and third portions of the word line 160 may be opposite each other in the second direction.

The first portions of the word line 160 may have a first width. In the word line 160, a region in which the second and third portions are opposite each other in the second direction may have a second width less than the first width. In this case, the second width may gradually decrease, and then gradually increase again, toward the first direction.

In some example embodiments, in a plan view, one sidewall of the word line 160 may not be formed along the sidewall profile of the first pillar insulation pattern 150a. For example, one sidewall of the word line 160 may have a straight line shape extending in the first direction. A top shape of the word line 160 may be changed by controlling the etching process of the conductive layer.

Shapes of the second and third portions of the word line 160 may be changed by shapes of upper surfaces of the first and second pillar insulation patterns 150a and 150b. For example, an upper surface of each of the first and second pillar insulation patterns 150a and 150b may have a rectangular shape having rounded vertices. In this case, the second and third portions of the word line 160 may be formed along sidewall profiles of the first and second pillar insulation patterns 150a. The second and third portions of the word line 160 may have a concave shape such that the width thereof may be decreased.

At least one of both sidewalls in the second direction of the word line 160 may include the concave portion.

Figure 36:
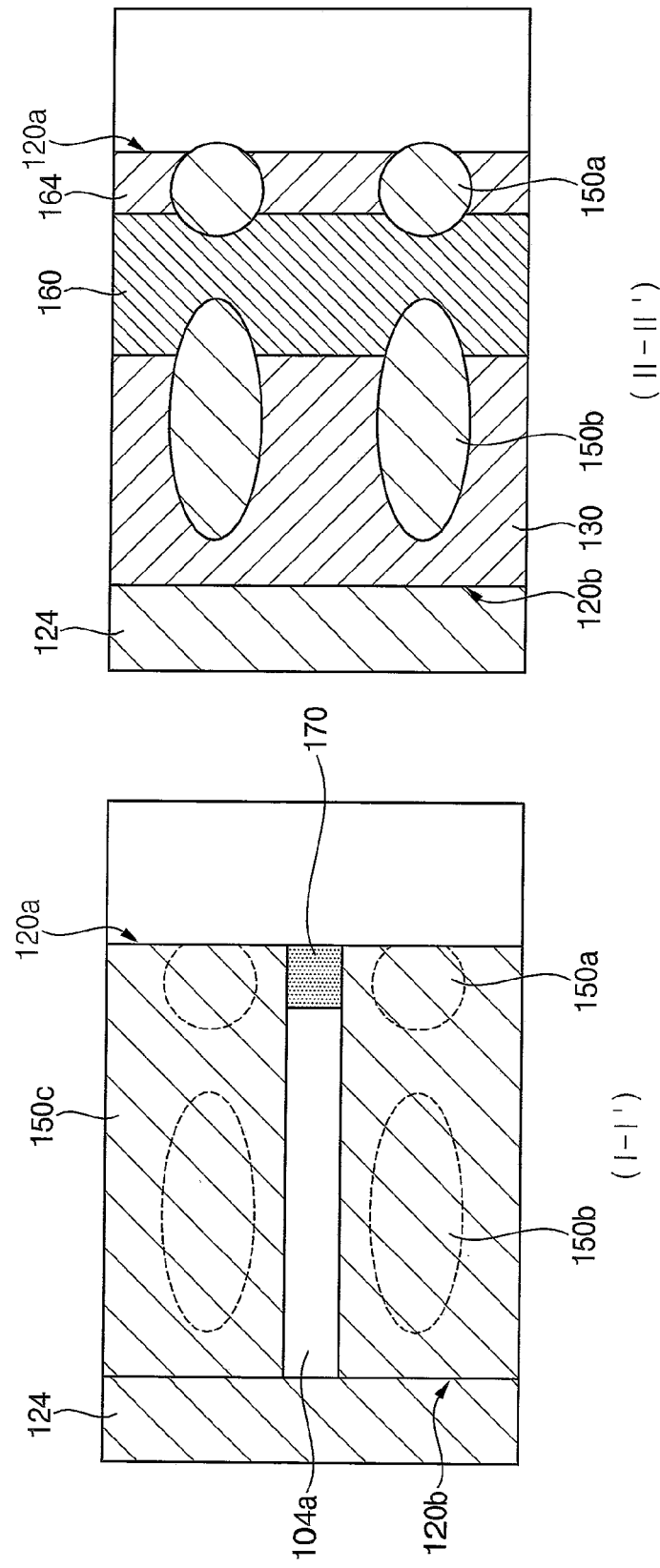
Figure 37:
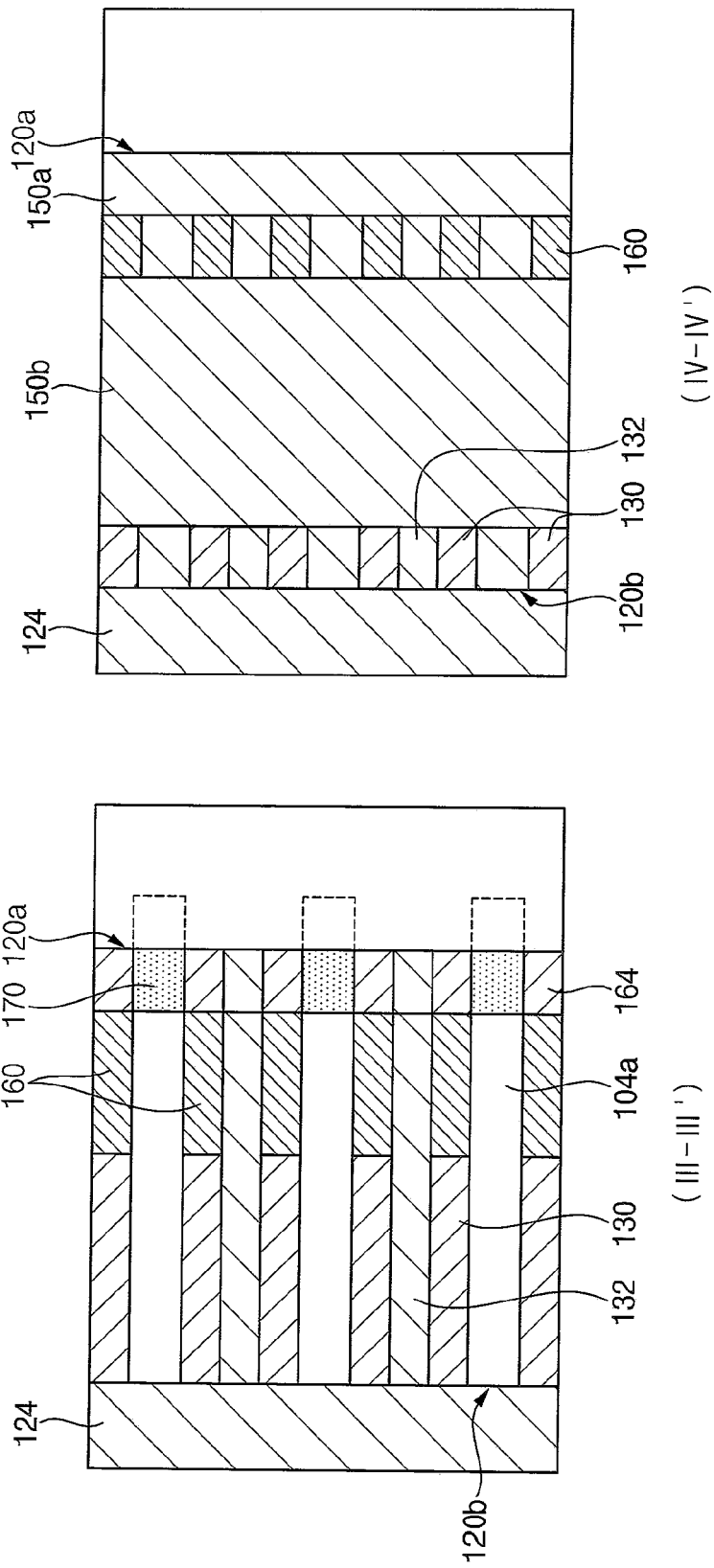

Referring to FIGS. 36 and 37, a fifth filling insulation pattern 164 may be formed to fill a portion of the fourth gap 162. The fifth filling insulation pattern 164 may be separated by the first pillar insulation pattern 150a, so that the fifth filling insulation patterns 164 may be spaced apart from each other in the first direction.

Thereafter, the sidewall of the silicon pattern 104a exposed by the first trench 120a may be doped with impurities to form a first impurity region 170.

Figure 38:
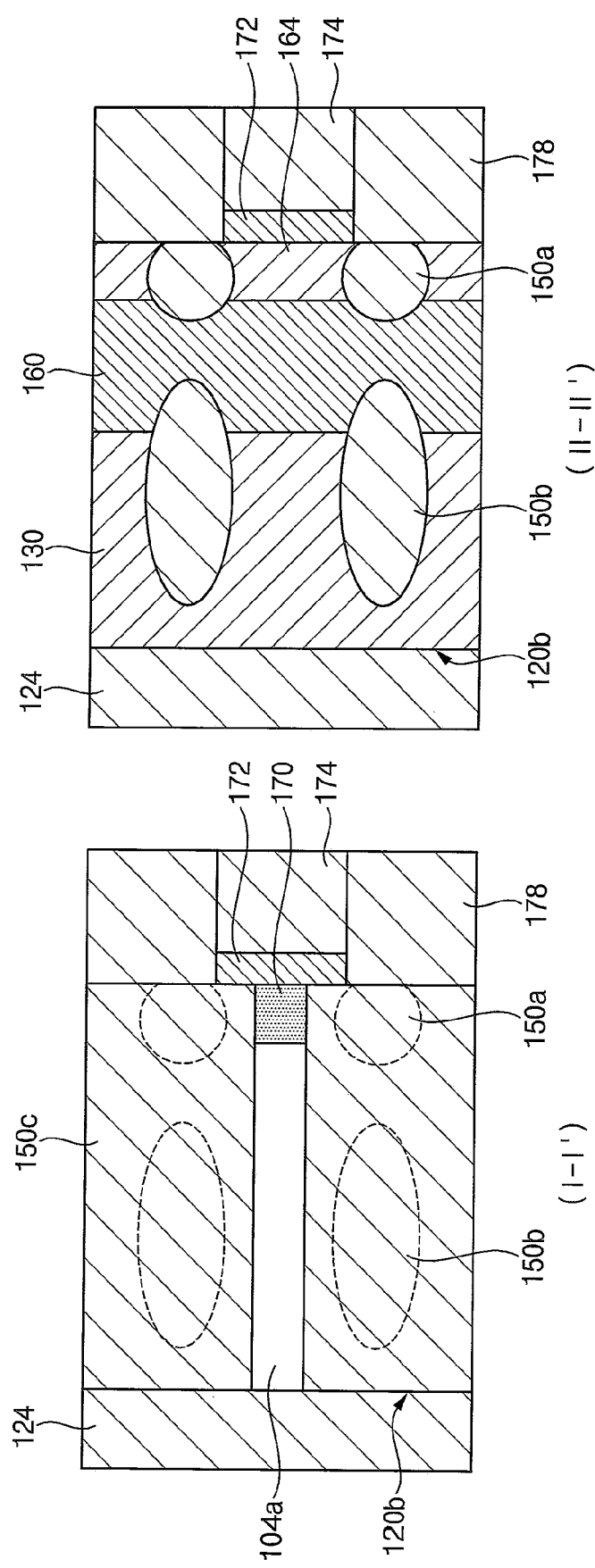
Figure 39:
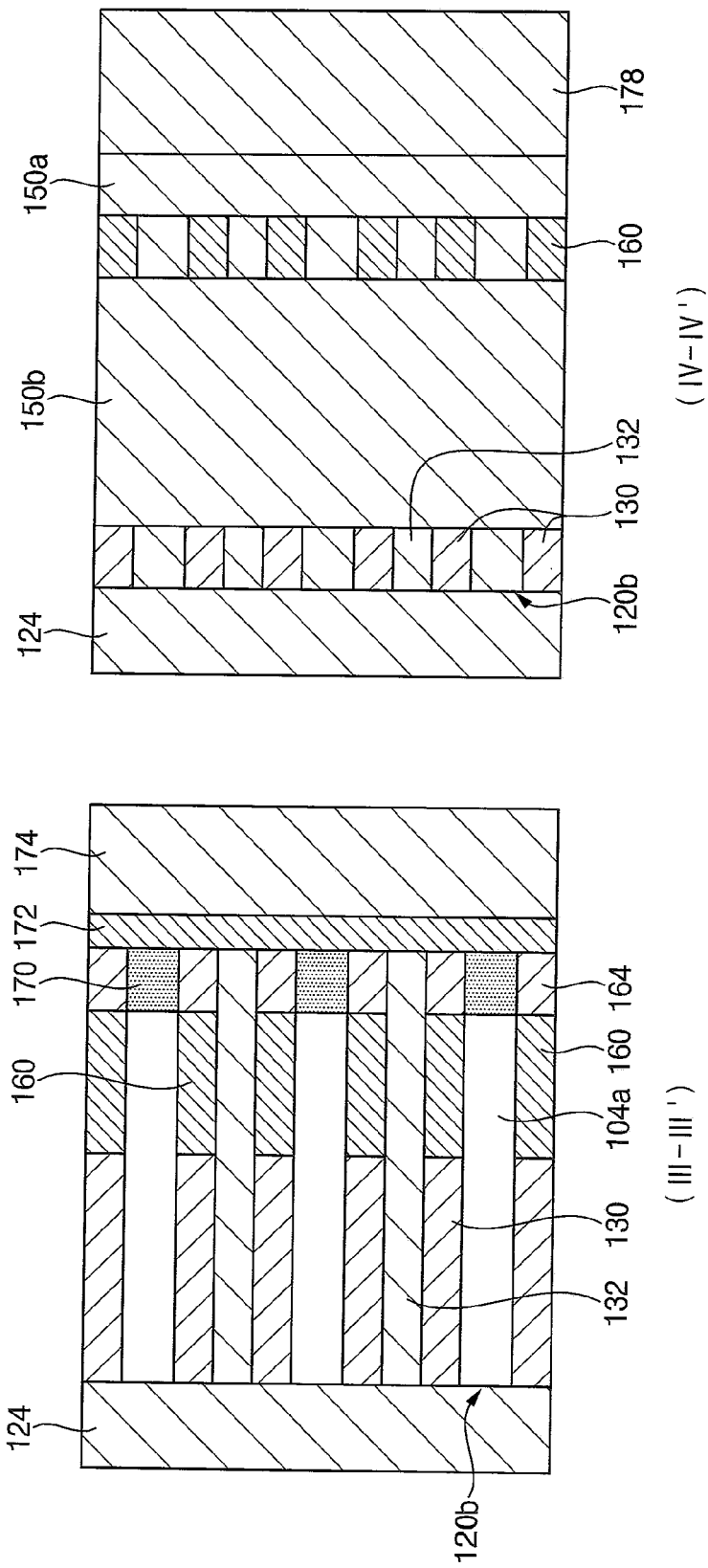

Referring to FIGS. 38 and 39, a bit line 172 and sixth and seventh filling insulation patterns 174 and 178 may be formed in the first trench 120a. The bit line 172 may include or may be formed of a metal. The bit line 172 may contact the first impurity region 170 of each layer.

The bit line 172 may have a pillar shape. A plurality of bit lines 172 may be repeatedly formed to be spaced apart from each other in the first direction.

The sixth and seventh filling insulation patterns 174 and 178 may include or may be silicon oxide.

Figure 40:
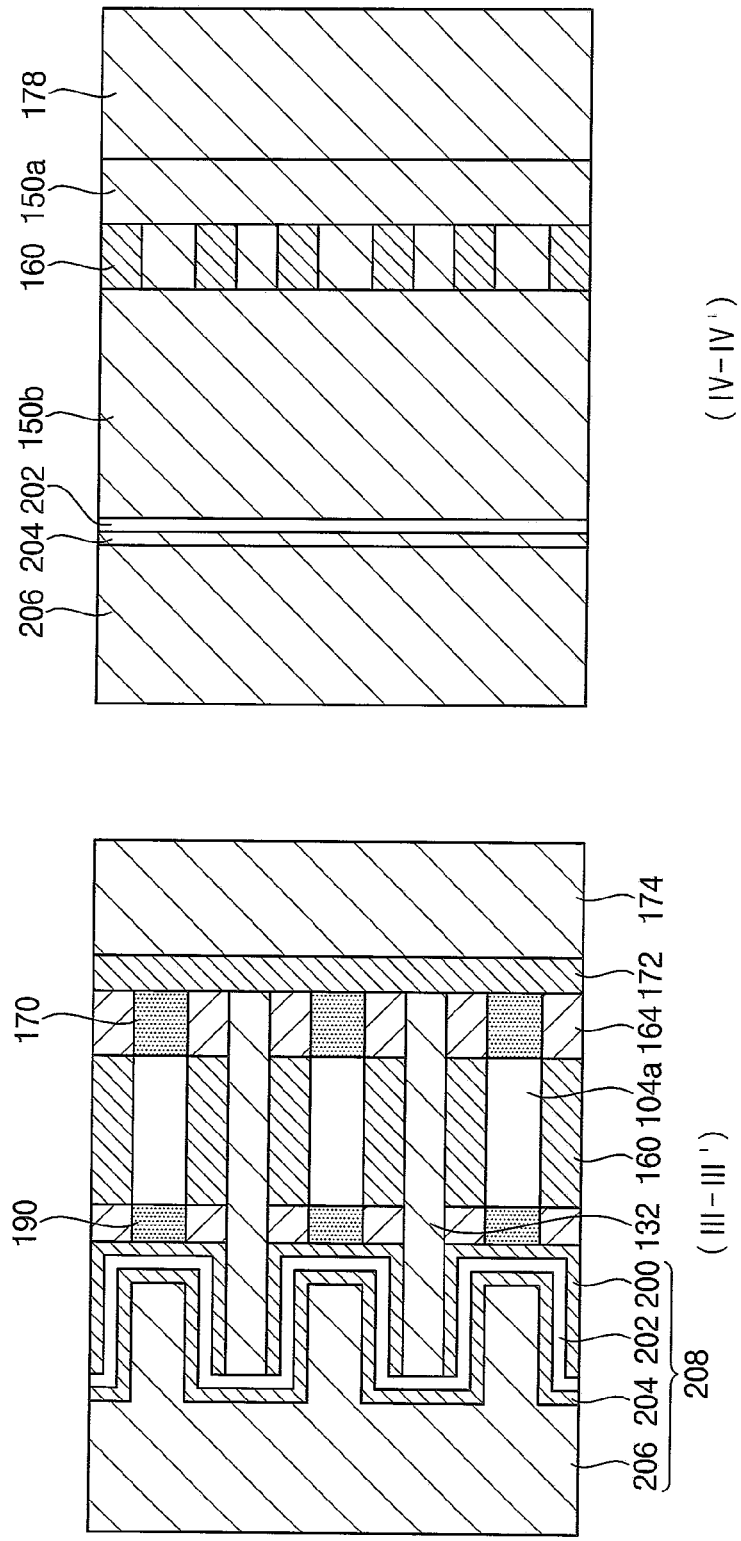

Referring to FIG. 40, the first filling insulation pattern 124 filling in the second trench 120b may be removed. Thus, the second filling insulation pattern 130, the third filling insulation pattern 132, the fourth filling insulation pattern 150c and the silicon pattern 104a may be exposed by the sidewalls of the second trench 120b.

Thereafter, a portion of the second filling insulation pattern 130 may be selectively removed. Also, a portion of the sidewall of the silicon pattern 104a may be removed.

Exposed sidewalls of the silicon pattern 104a may be doped with impurities to form a second impurity region 190. Therefore, the first impurity region 170 may be formed at a first side of the silicon pattern 104a and a second impurity region 190 may be formed at a second side of the silicon pattern 104a.

Thereafter, a lower electrode 200 may be formed on the second impurity region 190. The lower electrode 200 may contact the second impurity region 190, and may protrude laterally from the second impurity region 190. In example embodiments, the lower electrode 200 may have a cylindrical shape.

A dielectric layer 202 may be conformally formed on the lower electrode 200 and the third filling insulation pattern 132. An upper electrode 204 may be conformally formed on the dielectric layer 202. A plate electrode 206 may be formed on the upper electrode 204. The plate electrode 206 may extend in a vertical direction, and may completely fill the sixth gap 182.

The upper electrode 204 may include or may be a metal material.

Accordingly, a capacitor including the lower electrode 200, the dielectric layer 202 and the upper electrode 204 may be formed on the second impurity region 190. The lower electrode 200 of the capacitor may contact the second impurity region 190 of each layer. The capacitor may be formed in a horizontal direction in each layer to have a dielectric layer horizontally between a lower electrode and an upper electrode. The plate electrode 206 may be connected with the upper electrodes 204 in the vertical direction.

By the above process, memory cells stacked vertically on the silicon substrate may be manufactured.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   first pillar insulation patterns on a substrate, each of the first pillar insulation patterns extending in a vertical direction from an upper surface of the substrate, and the first pillar insulation patterns being spaced apart from each other in a first direction and being aligned in a line;
   second pillar insulation patterns on the substrate, each of the second pillar insulation patterns extending in the vertical direction, and the second pillar insulation patterns being spaced apart from each other in the first direction and being aligned in a line, wherein the second pillar insulation patterns and the first pillar insulation patterns overlap with each other in a second direction perpendicular to the first direction;

silicon patterns stacked on the substrate to be spaced apart from each other in the vertical direction, each of the silicon patterns extending in the second direction and being positioned between two first pillar insulation patterns and between two second pillar insulation patterns, and each of the silicon patterns including two sidewalls opposite each other in the first direction and having a straight line shape;

a word line on each of upper and lower surfaces of each silicon pattern, each word line extending in the first direction to cross the silicon patterns, and each word line contacting a sidewall of at least one insulation pattern of the first pillar insulation patterns and at least one insulation pattern of the second pillar insulation patterns;

a bit line contacting a first sidewall of at least a first silicon pattern of the silicon patterns, the bit line extending in the vertical direction; and a capacitor contacting a second sidewall of the first silicon pattern, the capacitor disposed in a horizontal direction to have a dielectric layer horizontally between a lower electrode and an upper electrode, wherein the word line includes first portions having sidewalls that do not contact the first pillar insulation patterns or the second pillar insulation patterns, second portions having sidewalls that contact the first pillar insulation patterns, and third portions having sidewalls that contact the second pillar insulation patterns, and wherein the first portions of the word line have edges having a straight line shape extending in the first direction, and each of the second portions of the word line and third portions of the word line have edges that have a concave shape.

2. The semiconductor device of claim 1, wherein at least one sidewall of the word line is formed along a sidewall profile of the first pillar insulation patterns or the second pillar insulation patterns.

3. The semiconductor device of claim 1, wherein the first portions of the word line have a first width, and regions of the word line in which the second portions and third portions overlap each other in the second direction have a second width less than the first width.

4. The semiconductor device of claim 1, wherein each word line has a first width at a portion where the word line and the silicon patterns overlap, and has a second width less than the first width at a portion where the word line and the silicon patterns do not overlap.

5. The semiconductor device of claim 1, further comprising, for each silicon pattern:

a first impurity region at a first end of the silicon pattern adjacent to a first edge of the silicon pattern; and a second impurity region at a second end of the silicon pattern adjacent to a second edge of the silicon pattern opposite the first edge.

6. The semiconductor device of claim 1, wherein upper surfaces of the first pillar insulation patterns have a first shape and upper surfaces of the second pillar insulation patterns have a second shape, and the first shape is different from the second shape.

7. The semiconductor device of claim 1, wherein a width in the second direction of an upper surface of each second pillar insulation pattern is greater than a width in the second direction of an upper surface of each first pillar insulation pattern.

8. The semiconductor device of claim 1, wherein shapes of upper surfaces among the first and second pillar insulation patterns include an elliptical shape, a circular shape, or a rectangular shape having rounded vertices.

9. The semiconductor device of claim 1, wherein each silicon pattern is spaced apart from sidewalls of the first pillar insulation patterns and is spaced apart from sidewalls of the second pillar insulation patterns.

10. A semiconductor device, comprising:

a multi-stacked structure in which memory cell layers and insulation layer patterns are alternately stacked on a substrate;

first pillar insulation patterns passing through the multi-stacked structure in a vertical direction and including sidewalls passing through the multi-stacked structure in the vertical direction, the first pillar insulation patterns being spaced apart from each other in a first direction, and being aligned in a line, wherein the sidewalls of adjacent first pillar insulation patterns in the first direction face each other; and second pillar insulation patterns passing through the multi-stacked structure in the vertical direction and including sidewalls passing through the multi-stacked structure in the vertical direction, the second pillar insulation patterns being spaced apart from each other in the first direction, and being aligned in a line, wherein the sidewalls of adjacent second pillar insulation patterns in the first direction face each other, and wherein each second pillar insulation pattern and a respective first pillar insulation pattern overlap each other in a second direction perpendicular to the first direction, wherein each of the memory cell layers includes:

a silicon pattern extending in the second direction between a set of first pillar insulation patterns and a set of second pillar insulation patterns, the silicon pattern being spaced apart from the set of first pillar insulation patterns and the set of second pillar insulation patterns, wherein sidewalls of the silicon pattern opposite each other in the first direction have a straight line shape; and a word line on each of upper and lower surfaces of the silicon pattern, each word line extending in the first direction to cross the silicon pattern, wherein at least one sidewall, extending along the first direction, of each word line includes a rounded concave portion.

11. The semiconductor device of claim 10, wherein at least one sidewall of each word line contacts a sidewall of at least one insulation pattern of the first pillar insulation patterns and/or at least one insulation pattern of the second pillar insulation patterns.

12. The semiconductor device of claim 10, further comprising:

a bit line contacting a first sidewall of each silicon pattern, the bit line extending in the vertical direction; and for each silicon pattern, a capacitor contacting a second sidewall of the silicon pattern, the capacitor disposed in a horizontal direction.

13. The semiconductor device of claim 10, further comprising, for each silicon pattern:

a first impurity region at a first end of the silicon pattern adjacent to a first edge of the silicon pattern; and a second impurity region at a second end of the silicon pattern adjacent to a second edge of the silicon pattern opposite the first edge.

14. The semiconductor device of claim 10, wherein a width in the second direction of an upper surface of each second pillar insulation pattern is greater than a width in the second direction of an upper surface of each first pillar insulation pattern.

15. A semiconductor device, comprising:
a silicon pattern spaced apart from a surface of a substrate, the silicon pattern having two sidewalls opposite each other in a first direction, the sidewalls having a straight line shape, and the silicon pattern extending in a second direction perpendicular to the first direction;
a word line on each of an upper surface and a lower surface of the silicon pattern, each word line extending in the first direction to cross the silicon pattern;
a first impurity region in the silicon pattern adjacent to a first sidewall of the silicon pattern;
a second impurity region in the silicon pattern adjacent to a second sidewall of the silicon pattern opposite the first sidewall;
a bit line on the first sidewall of the silicon pattern, the bit line extending in a vertical direction, and the bit line contacting the first impurity region; and
a capacitor on the second sidewall of the silicon pattern, the capacitor disposed in a horizontal direction to have a dielectric layer horizontally between a lower electrode and an upper electrode, the capacitor contacting the second impurity region,
wherein sidewalls of each word line opposite to each other in the second direction and overlapping the silicon pattern have a straight line shape extending in the first direction, and
wherein portions of the sidewalls of each word line opposite to each other in the second direction and not overlapping the silicon pattern have a concave shape such that a width is decreased, and wherein for each word line, each first pillar insulation pattern of a group of first pillar insulation patterns on the substrate fills in a respective first concave region within the word line to have a first shape and first size, and each second pillar insulation pattern of a group of second pillar insulation patterns on the substrate fills in a respective second concave region within the word line to have a second shape different from the first shape and/or a second size different from the first size.

16. The semiconductor device of claim 15, wherein:
each first pillar insulation pattern of the group of first pillar insulation patterns extends in the vertical direction, the first pillar insulation patterns being spaced apart from each other in the first direction and being aligned in a line; and
each second pillar insulation patterns of the group of second pillar insulation patterns extends in the vertical direction, the second pillar insulation patterns being spaced apart from each other in the first direction and being aligned in a line,
wherein each second pillar insulation patterns overlaps in the second direction with a respective first pillar insulation patterns.

17. The semiconductor device of claim 16, wherein the silicon pattern is disposed between a pair of the first pillar insulation patterns and between a pair of the second pillar insulation patterns, and the silicon pattern is spaced apart from sidewalls of the first pillar insulation patterns and sidewalls of the second pillar insulation patterns.

18. The semiconductor device of claim 16, wherein each word line contacts at least one sidewall of the first pillar insulation patterns and/or at least one sidewall of the second pillar insulation patterns.

19. The semiconductor device of claim 16, wherein upper surfaces of the first pillar insulation patterns have a first shape and upper surfaces of the second pillar insulation patterns have a second shape, and the first shape is different from the second shape.

* * * * *